US009240402B2

(12) United States Patent
Masliah et al.

(10) Patent No.: US 9,240,402 B2
(45) Date of Patent: Jan. 19, 2016

(54) ELECTRONIC CIRCUITS INCLUDING A MOSFET AND A DUAL-GATE JFET

(71) Applicant: ACCO Semiconductor, Inc., Sunnyvale, CA (US)

(72) Inventors: Denis A. Masliah, St.-Germain en Laye (FR); Alexandre G. Bracale, Paris (FR)

( * ) Notice: Subject to any disclaimer, the term of this patent is extended or adjusted under 35 U.S.C. 154(b) by 0 days.

(21) Appl. No.: 14/531,754

(22) Filed: Nov. 3, 2014

(65) Prior Publication Data

US 2015/0054038 A1 Feb. 26, 2015

Related U.S. Application Data

(60) Continuation-in-part of application No. 13/803,792, filed on Mar. 14, 2013, now Pat. No. 8,928,410, which is a division of application No. 13/443,611, filed on Apr. 10, 2012, now Pat. No. 8,400,222, which is a continuation of application No. 13/107,411, filed on May 13, 2011, now Pat. No. 8,179,197, which is a division of application No. 12/686,573, filed on Jan. 13, 2010, now Pat. No. 7,969,243.

(60) Provisional application No. 61/171,689, filed on Apr. 22, 2009, provisional application No. 61/923,579, filed on Jan. 3, 2014.

(51) Int. Cl.
*H01L 29/66* (2006.01)
*H01L 27/06* (2006.01)
*H01L 29/78* (2006.01)
(Continued)

(52) U.S. Cl.
CPC ............ *H01L 27/0617* (2013.01); *H01L 29/78* (2013.01); *H01L 29/808* (2013.01); *H03F 1/0266* (2013.01); *H03F 1/223* (2013.01); *H03F 1/56* (2013.01); *H03F 3/195* (2013.01); *H03F 3/1935* (2013.01); *H03F 3/245* (2013.01); *H01L 27/095* (2013.01); *H01L 27/098* (2013.01); *H03F 2200/18* (2013.01); *H03F 2200/222* (2013.01); *H03F 2200/387* (2013.01)

(58) Field of Classification Search
USPC .......... 438/169, 176, 197; 257/260, 262, 272, 257/273, 280, 338, 497, E21.544, E21.637, 257/E27.015
See application file for complete search history.

(56) References Cited

U.S. PATENT DOCUMENTS 4,228,367 A 10/1980 Brown
4,255,714 A 3/1981 Rosen
(Continued)

FOREIGN PATENT DOCUMENTS

EP 2006009009 1/1996
GB 2336485 A 10/1999
(Continued)

OTHER PUBLICATIONS

U.S. Appl. No. 14/493,695, Herve Cam, Body Biasing for RF Switch Optimization, filed Sep. 23, 2014.
(Continued)

*Primary Examiner* — Charles Garber
*Assistant Examiner* — Abdulfattah Mustapha
(74) *Attorney, Agent, or Firm* — Peters Verny, LLP

(57) ABSTRACT

Electronic circuits and methods are provided for various applications including signal amplification. An exemplary electronic circuit comprises a MOSFET and a dual-gate JFET in a cascode configuration. The dual-gate JFET includes top and bottom gates disposed above and below the channel. The top gate of the JFET is controlled by a signal that is dependent upon the signal controlling the gate of the MOSFET. The control of the bottom gate of the JFET can be dependent or independent of the control of the top gate. The MOSFET and JFET can be implemented as separate components on the same substrate with different dimensions such as gate widths.

6 Claims, 20 Drawing Sheets

(51) Int. Cl.

| | | |
|---|---|---|
| *H01L 29/808* | (2006.01) | |
| *H03F 1/02* | (2006.01) | |
| *H03F 1/22* | (2006.01) | |
| *H03F 1/56* | (2006.01) | |
| *H03F 3/193* | (2006.01) | |
| *H03F 3/195* | (2006.01) | |
| *H03F 3/24* | (2006.01) | |
| *H01L 27/095* | (2006.01) | |
| *H01L 27/098* | (2006.01) | |

(56) References Cited

U.S. PATENT DOCUMENTS

| | | |
|---|---|---|
| 4,353,036 A | 10/1982 | Hoover |
| 4,523,111 A | 6/1985 | Baliga |
| 4,811,075 A | 3/1989 | Eklund |
| 4,864,454 A | 9/1989 | Wolfe |
| 5,061,903 A | 10/1991 | Vasile |
| 5,126,807 A | 6/1992 | Baba et al. |
| 5,296,400 A | 3/1994 | Park et al. |
| 5,537,078 A | 7/1996 | Strong |
| 5,543,643 A | 8/1996 | Kapoor |
| 5,559,049 A | 9/1996 | Cho |
| 5,677,927 A | 10/1997 | Fullerton et al. |
| 5,898,198 A | 4/1999 | Herbert et al. |
| 5,912,490 A | 6/1999 | Hebert et al. |
| 5,969,582 A | 10/1999 | Boesch et al. |
| 6,061,008 A | 5/2000 | Abbey |
| 6,061,555 A | 5/2000 | Bultman et al. |
| 6,081,159 A | 6/2000 | Kim et al. |
| 6,088,484 A | 7/2000 | Mead |
| 6,242,978 B1 | 6/2001 | Danielsons |
| 6,275,177 B1 | 8/2001 | Ho et al. |
| 6,300,835 B1 | 10/2001 | Seely et al. |
| 6,384,688 B1 | 5/2002 | Fujioka et al. |
| 6,414,545 B1 | 7/2002 | Zhang |
| 6,535,050 B2 | 3/2003 | Baudelot et al. |
| 6,570,518 B2 | 5/2003 | Riley et al. |
| 6,600,369 B2 | 7/2003 | Mitzlaff |
| 6,614,281 B1 | 9/2003 | Baudelot et al. |
| 6,633,195 B2 | 10/2003 | Baudelot et al. |
| 6,703,684 B2 | 3/2004 | Udrea et al. |
| 6,784,470 B2 | 8/2004 | Davis |
| 7,049,669 B2 | 5/2006 | Ma et al. |
| 7,162,042 B2 | 1/2007 | Spencer et al. |
| 7,259,621 B2 | 8/2007 | Kusunoki et al. |
| 7,312,481 B2 | 12/2007 | Chen et al. |
| 7,348,826 B1 | 3/2008 | Klein et al. |
| 7,378,912 B2 | 5/2008 | Tanahashi et al. |
| 7,522,079 B1 | 4/2009 | Wu |
| 7,554,397 B2 | 6/2009 | Vitzilaios et al. |
| 7,656,229 B2 | 2/2010 | Deng et al. |
| 7,679,448 B1 | 3/2010 | McAdam et al. |
| 7,808,415 B1 | 10/2010 | Robbe et al. |
| 7,863,645 B2 | 1/2011 | Masliah et al. |
| 7,952,431 B2 | 5/2011 | Quack et al. |
| 7,969,243 B2 | 6/2011 | Bracale et al. |
| 7,969,341 B2 | 6/2011 | Robbe et al. |
| 2001/0015676 A1 | 8/2001 | Takikawa et al. |
| 2001/0050589 A1 | 12/2001 | Baudelot et al. |
| 2002/0093442 A1 | 7/2002 | Gupta |
| 2002/0094795 A1 | 7/2002 | Mitzlaff |
| 2002/0105360 A1 | 8/2002 | Kim et al. |
| 2002/0113650 A1 | 8/2002 | Kim et al. |
| 2002/0145170 A1 | 10/2002 | Murakami |
| 2003/0073269 A1 | 4/2003 | Tran et al. |
| 2004/0085127 A1 | 5/2004 | Matsuyoshi |
| 2004/0248529 A1 | 12/2004 | Park |
| 2005/0007200 A1 | 1/2005 | Inoue et al. |
| 2005/0212583 A1 | 9/2005 | Pai |
| 2005/0285189 A1 | 12/2005 | Shibib et al. |
| 2005/0287966 A1 | 12/2005 | Yoshimi et al. |
| 2006/0228850 A1 | 10/2006 | Tsai et al. |
| 2007/0018865 A1 | 1/2007 | Chang et al. |
| 2007/0178856 A1 | 8/2007 | Mitzlaff et al. |
| 2007/0182485 A1 | 8/2007 | Ko |
| 2008/0031382 A1 | 2/2008 | Aoki |
| 2008/0237704 A1* | 10/2008 | Williams et al. ............. 257/338 |
| 2008/0291069 A1 | 11/2008 | Inukai et al. |
| 2009/0066549 A1 | 3/2009 | Thomsen et al. |
| 2009/0286492 A1 | 11/2009 | Mallet-Guy et al. |
| 2010/0026393 A1 | 2/2010 | Keerti et al. |
| 2011/0241083 A1 | 10/2011 | Khemka et al. |
| 2013/0032824 A1 | 2/2013 | Hayashi et al. |

FOREIGN PATENT DOCUMENTS

| | | |
|---|---|---|
| IL | 125022 | 9/2001 |
| JP | 56165350 A | 5/1980 |
| JP | 0399466 | 4/1991 |
| JP | 10107214 A1 | 4/1998 |
| WO | 9956311 | 11/1999 |
| WO | 0139451 | 5/2001 |
| WO | 2006054148 | 5/2006 |
| WO | 2007042850 | 4/2007 |
| WO | 2007075759 A2 | 7/2007 |
| WO | 2008037650 A1 | 4/2008 |

OTHER PUBLICATIONS

U.S. Appl. No. 13/803,792, Alexandre G. Bracale, Electronic circuits including a MOSFET and a dual-gate JFET, filed Mar. 14, 2013.

U.S. Appl. No. 14/183,215, Herve Cam, Switch Controls, filed Feb. 18, 2014.

Gautier, D., et al., "Improved Delta Sigma Modulators for High Speed Applications," Acco Semiconductors, Mar. 25, 2009.

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choi, Y. H. et al., "Gated UWB Pulse Signal Generation," IEEE, 2004 pp. 122-124.

PCT/US2008/001938 Int'l Search Report and Written Opinion, Jun. 26, 2008.

PCT/IB05/003426 Int'l Search Report, Mar. 20, 2006.

PCT/IB05/003426 Written Opinion, May 16, 2007.

PCT/IB05/003029 Int'l Search Report, Jul. 6, 2006.

PCT/IB05/003029 Written Opinion, Mar. 12, 2008.

PCT/US10/27921 Int'l Search Report and Written Opinion, May 10, 2010.

PCT/US10/30770 Int'l Search Report and Written Opinion, Jun. 16, 2010.

PCT/US10/041985 Int'l Search Report and Written Opinion, Sep. 9, 2010.

PCT/US11/32488 Int'l Search Report and Written Opinion, Jun. 28, 2011.

Vaes, H. M. J. et al., "High Voltage, High Current Lateral Devices," IEDM Technical Digest, 1988, pp. 87-90.

Pocha, Michael D. et al. "Threshold Voltage Controllability in Double-Diffused MOS Transistors," IEEE Transactions on Electronic Devices, vol. ED-21, No. 12, Dec. 1994.

U.S. Appl. No. 12/951,958 Non-Final Office Action, mailed Dec. 29, 2010.

U.S. Appl. No. 12/951,958 Applicants' Amendment A, submitted Mar. 22, 2011.

U.S. Appl. No. 12/951,958 Final Office Action, mailed May 20, 2011.

U.S. Appl. No. 12/951,958 Applicants' Amendment B, submitted Jul. 26, 2011.

U.S. Appl. No. 12/070,019 Pre-Interview First Office Action, mailed Jul. 12, 2010.

U.S. Appl. No. 12/070,019 Applicants' Amendment A, submitted Jul. 21, 2010.

U.S. Appl. No. 12/951,972 non-final Office action, mailed Aug. 5, 2011.

U.S. Appl. No. 12/951,972 Applicants' Amendment B, submitted Sep. 9, 2011.

U.S. Appl. No. 12/951,972 final Office action, mailed Oct. 19, 2011.

(56) References Cited

OTHER PUBLICATIONS

U.S. Appl. No. 12/951,972 Applicants' Amendment C, submitted Nov. 17, 2011.
U.S. Appl. No. 12/951,972 Advisory Action, mailed Nov. 29, 2011.
U.S. Appl. No. 12/951,972 Pre-Brief Conference Request, submitted on Apr. 17, 2012.
U.S. Appl. No. 12/951,958 non-final Office action, mailed Aug. 9, 2011.
U.S. Appl. No. 12/951,958 Applicants' Amendment C, submitted Sep. 9, 2011.
U.S. Appl. No. 12/951,958 final Office action, mailed Oct. 28, 2011.
U.S. Appl. No. 12/951,958 Applicants' Amendment D, submitted Jan. 30, 2012.
U.S. Appl. No. 12/951,958 Advisory Actions and Interview Summaries, Feb. to Mar. 2012.
Search Report for Taiwan Patent Application No. 099112711, completed Aug. 23, 2011.
Jackel, Lawrence D., et al., "CASFET: A MOSFET-JFET Cascode Device with Ultralow Gate Capacitance," IEEE Transactions on Electron Devices, IEEE SErvice Center, Piscataway, NJ, vol. ED-31, No. 12, Dec. 1, 1984, pp. 1752-1754.
EP 10767521.7 Extended European Search Report mailed Feb. 6, 2013.
EP 10767521.7 Reply to Extended European Search Report, submitted Jul. 18, 2013.
EP 10767521.7 Article 94(3) EPC Communication, mailed Nov. 27, 2013.
EP 10767521.7 Applicants' Reply to Article 94(3) EPC Communication, submitted Mar. 24, 2014.
JP 2012-507253 First Office Action, mailed May 28, 2013.
JP 2012-507253 Response to First Office Action, submitted Aug. 26, 2013.
KR 10-2011-7027746 Notice of Preliminary Rejection, mailed Jul. 24, 2013.
CN 201080017947.3 Response to Second Office Action, submitted Sep. 24, 2014.
CN 201080017947.3 Response to First Office Action, submitted Mar. 20, 2014.
CN 201080017947.3 First Office Action, mailed Nov. 5, 2013.
CN 201080017947.3 Second Office Action, mailed Jul. 21, 2014.
EP 10767521.7 Partial European Search Report mailed May 29, 2015.
EP 10767521.7 Extended European Search Report mailed Sep. 15, 2015.

* cited by examiner

ELECTRONIC CIRCUITS INCLUDING A MOSFET AND A DUAL-GATE JFET

CROSS-REFERENCE TO RELATED APPLICATIONS

This application is a Continuation-In-Part of U.S. patent application Ser. No. 13/803,792 filed on Mar. 14, 2013 which is a Continuation-In-Part of U.S. patent application Ser. No. 13/443,611 filed on Apr. 10, 2012, now U.S. Pat. No. 8,400,222 issued on Mar. 19, 2013, which is a Continuation of U.S. patent application Ser. No. 13/107,411 filed on May 13, 2011, now U.S. Pat. No. 8,179,197 issued on May 15, 2012, which is a Divisional application of U.S. patent application Ser. No. 12/686,573 filed on Jan. 13, 2010, now U.S. Pat. No. 7,969,243 issued on Jun. 28, 2011, all entitled "Electronic Circuits including a MOSFET and a Dual-Gate JFET;" U.S. patent application Ser. No. 12/686,573 claims the benefit of U.S. Provisional Patent Application No. 61/171,689 filed on Apr. 22, 2009 and entitled "Electronic Circuits including a MOSFET and a Dual-Gate JFET and having a High Breakdown Voltage;" each of the above patent application are incorporated herein by reference. This application also claims the benefit of U.S. Provisional Patent Application No. 61/923,578 filed Jan. 3, 2014 and entitled "Electronic Circuits including a MOSFET and a Dual-Gate JFET," also incorporated herein by reference. This application is also related to U.S. patent application Ser. No. 12/070,019 filed on Feb. 13, 2008 and entitled "High Breakdown Voltage Double-Gate Semiconductor Device," now U.S. Pat. No. 7,863,645 issued on Jan. 4, 2011, which is also incorporated herein by reference.

BACKGROUND

1. Field of Invention

The present invention relates generally to semiconductor devices and more particularly to semiconductor devices configured for power applications.

2. Related Art

Complementary metal-oxide semiconductor (CMOS) devices designed for radio-frequency (RF) power applications have traditionally required a tradeoff between improved RF performance versus a higher breakdown voltage. For example, the RF performance of a CMOS device may be improved by reducing gate geometries (e.g., by using short channel lengths). A smaller gate geometry, however, reduces the breakdown voltage of the CMOS device. Because the reduced breakdown voltage limits the voltage swing available at the output of the CMOS device in an amplifier configuration, such CMOS devices are less useful in power applications.

In one approach to the breakdown voltage problem, CMOS devices may be designed for greater current drive with a lower voltage swing. Greater current drive may, however, require the width of a transistor in the CMOS device to be made large thus presenting an undesired capacitive load to the driving circuit.

Another approach to the breakdown voltage problem uses Laterally Diffused Metal-Oxide-Semiconductor (LDMOS) transistors. LDMOS transistors have a drift region between an active region and a drain. The drift region is lightly doped and experiences the largest voltage swings. Because the doping concentration in the drift region is limited by the breakdown voltage requirements, LDMOS devices tradeoff a higher breakdown voltage for a higher total resistance of the drain-current flowing between the drain and the source terminals (known as the on-state resistance).

Another approach to the breakdown voltage problem uses devices with thicker and higher resistivity substrates. These devices may offer higher-voltage performance but also introduce higher on-state losses. These devices include Reduced Surface Field (RESURF) devices in which the depletion region of the substrate diode interacts with the depletion region of the lateral diode to reduce the surface field. In these devices, the voltage breakdown is increased because of the lateral widening of the depletion zone.

There is, therefore, a need for a high breakdown voltage semiconductor device that provides improved RF capability and higher power as compared to conventional semiconductor devices.

SUMMARY

The present invention provides various electronic circuits for use as power amplifiers for amplifying input signals. An exemplary circuit comprises a MOSFET and a JFET, both including a source and a drain, where the source of the JFET is directly coupled to the drain of the MOSFET. The MOSFET also includes a gate, while the JFET also includes both a top gate and a bottom gate. The gates of the MOSFET and of the JFET, in some embodiments, have different widths. In various embodiments the source and drain of both the MOSFET and JFET, and the top and bottom gates of the JFET, are defined within the substrate, while the gate of the MOSFET gate is disposed on the substrate. In some instances the substrate comprises a silicon on insulator wafer having a silicon layer over an insulator layer, and in these embodiments the features defined within the substrate are defined within the silicon layer.

In various embodiments the top gate of the JFET is coupled to the gate of the MOSFET. In some of these embodiments the bottom gate of the JFET is also coupled to the gate of the MOSFET, and in some of these embodiments the top and bottom gates of the JFET are both coupled to a DC bias source.

In various embodiments of the exemplary circuit the top gate of the JFET is coupled to the bottom gate of the JFET and both gates are independent of the gate of the MOSFET. In some of these embodiments the top and bottom gates of the JFET are both coupled to a DC bias source, while in other of these embodiments the top and bottom gates of the JFET are both coupled to ground. In still further of these embodiments the top gate of the JFET is coupled to a first DC bias source and/or the bottom gate of the JFET is coupled to a second DC bias source or ground.

The present invention is also directed to various devices. An exemplary device comprises a transceiver coupled to a power amplifier as set forth above. The transceiver, in various embodiments, is configured to produce a signal having a frequency in the range of about 700 MHz to about 2.5 GHz or to produce a signal having a frequency in the range of about 150 MHz to about 6 GHz. In some embodiments the transceiver is disposed on a same substrate as the MOSFET and the JFET. Various embodiments further comprise an output matching circuit coupled to the drain of the JFET.

Further, the present invention also provides methods for signal amplification. An exemplary method comprises controlling a gate of a MOSFET with a first signal, controlling a top gate of a JFET with a second signal, and controlling a bottom gate of the JFET with a third signal, where the JFET is in a cascode configuration with the MOSFET. In various embodiments the second signal is dependent on the first signal and in some of these embodiments the third signal is dependent on the second signal. Similarly, in various embodiments the second signal is independent on the first signal and in some of these embodiments the third signal is dependent on the second signal.

The present invention further provides methods of making electronic circuits. An exemplary method comprises providing a silicon on insulator wafer having a silicon layer over an insulator layer embedded within the wafer, defining within the silicon of the wafer, such as by ion implantation, a MOSFET including a source and a drain defining within the silicon of the wafer a JFET including a source, a drain, a top gate, and a bottom gate, and forming a gate of the MOSFET on the silicon, such as by photolithography. In various embodiments the method further includes forming a metal layer in electrical communication with both the source of the JFET and the drain of the MOSFET so that the source of the JFET is directly coupled to the drain of the MOSFET.

Another exemplary circuit of the present invention comprises a MOS device formed substantially in a substrate. The substrate includes a first well defined within the substrate, where the well is characterized by a top surface formed, for example, by planarizing the substrate. Defined within the well are a bottom gate, a first channel defined between the bottom gate and the top surface, a first drain, a second drain between the first drain and the source, a first gate between the first and second drains, and a gap between the source and the second drain. The MOS device further comprises a dielectric layer disposed above the top surface of the first well and aligned with the gap and a second gate disposed above the dielectric layer. In the exemplary MOS device the first gate controls the first channel and the second gate controls a second channel, also disposed within the first well. The first and second channels are doped differently, such that when one is doped to be n-type, the other is doped to be p-type.

Various embodiments of the exemplary MOS device also include two sidewalls defined in the first well such that both sidewalls are joined to the bottom gate. A second well is defined within the first well by a volume enclosed between the two sidewalls and between the bottom gate and the top surface. In one configuration, one of the two sidewalls is disposed between the first and second gates such that the first source, second gate, and second drain comprise a MOSFET in a third well on one side of the one sidewall. In these embodiments, the first well also includes, defined therein, a second source disposed between the one side wall and the first gate. In these embodiments, the second source, first gate, and first drain are all within the second well, and together with the bottom gate and first channel comprise a dual-gate JFET. In these embodiments, the one sidewall is disposed between the second source and the second drain and therefore the MOSFET and JFET are electrically coupled from the second drain to the second source by a conductive path defined above the top surface, such as a metal trace disposed on the substrate. In these embodiments one or both sidewalls can have the same doping as the bottom gate. At least one sidewall is exposed at the top surface to allow a voltage to be applied to the bottom gate.

In another configuration, the two sidewalls are disposed such that the first source, first and second drains, first gate, and first channel are all disposed within the second well. These embodiments do not include the second source, nor the third well. Rather, the first channel provides electrical conduction between the second drain and the first drain and is controlled by the first gate, and a second channel disposed within the second well provides electrical conduction between the first source and the second drain and is controlled by the second gate. In these embodiments the second channel is disposed between the bottom gate and the second gate. As noted, the first and second channels are doped such that when one is doped to be n-type, the other is doped to be p-type, therefore, in these embodiments opposing sides of the second well are doped with one side n-type and the other side p-type that meet at a boundary interface that extends between the second drain and the bottom gate.

BRIEF DESCRIPTION OF THE DRAWINGS

Elements in the figures are illustrated for simplicity and clarity and are not drawn to scale. The dimensions of some of the elements may be exaggerated relative to other elements to help improve the understanding of various embodiments of the invention.

DETAILED DESCRIPTION

The present disclosure is directed to double-gate semiconductor devices characterized by high breakdown voltages that allow for a large excursion of the output voltage, making these semiconductor devices useful for power applications, such as power amplification. The double-gate semiconductor devices disclosed herein comprise a metal-oxide-semiconductor (MOS) gate and a junction gate, in which the bias of the junction gate may be a function of the gate voltage of the MOS gate. The breakdown voltage of such a double-gate semiconductor device is the sum of the breakdown voltages of the MOS gate and the junction gate. Because an individual junction gate has an intrinsically high breakdown voltage, the breakdown voltage of the double-gate semiconductor device is higher than the breakdown voltage of an individual MOS gate.

The double-gate semiconductor device provides improved RF capability in addition to operability at higher power levels as compared to conventional complementary metal-oxide semiconductor (CMOS) devices. The double-gate semiconductor device may be fabricated substantially on and/or in a substrate using techniques of semiconductor fabrication known in the art and may use standard fabrication processes for CMOS and logic devices with minor modifications in the process flow.

A MOS gate may include a metal-oxide-semiconductor structure that, when a voltage is applied to the MOS gate, modifies the charge distribution in a semiconductor structure, thus controlling the conductive characteristics of the semiconductor structure. The MOS gate can thus function as an electrically-controlled gate or switch. This type of gate may be found in a metal-oxide-semiconductor field effect transistor (MOSFET) device. A junction gate includes a region of a channel of semiconductor material that has doping characteristics that are opposite that of the rest of the channel such that when a voltage is applied to the junction gate the charge distribution in the channel is modified and thereby controls the conductive characteristics of the channel. The junction gate can thus function as an electrically-controlled gate or switch. This type of gate may be found in a junction field effect transistor (JFET). The effective resistance of the junction gate is the resistance of the channel as controlled by the voltage of the junction gate.

Double-gate semiconductor devices disclosed herein may be fabricated to include one or more implantation regions between the MOS gate and the junction gate. Embodiments without an implantation region between the MOS gate and the junction gate may provide a higher spatial density configuration for the double-gate semiconductor device than embodiments that include one or more implantation regions between the MOS gate and the junction gate. The principles of operation of these various embodiments are similar, except that a depletion region between the MOS gate channel and a drift region is modified.

Figure 1:
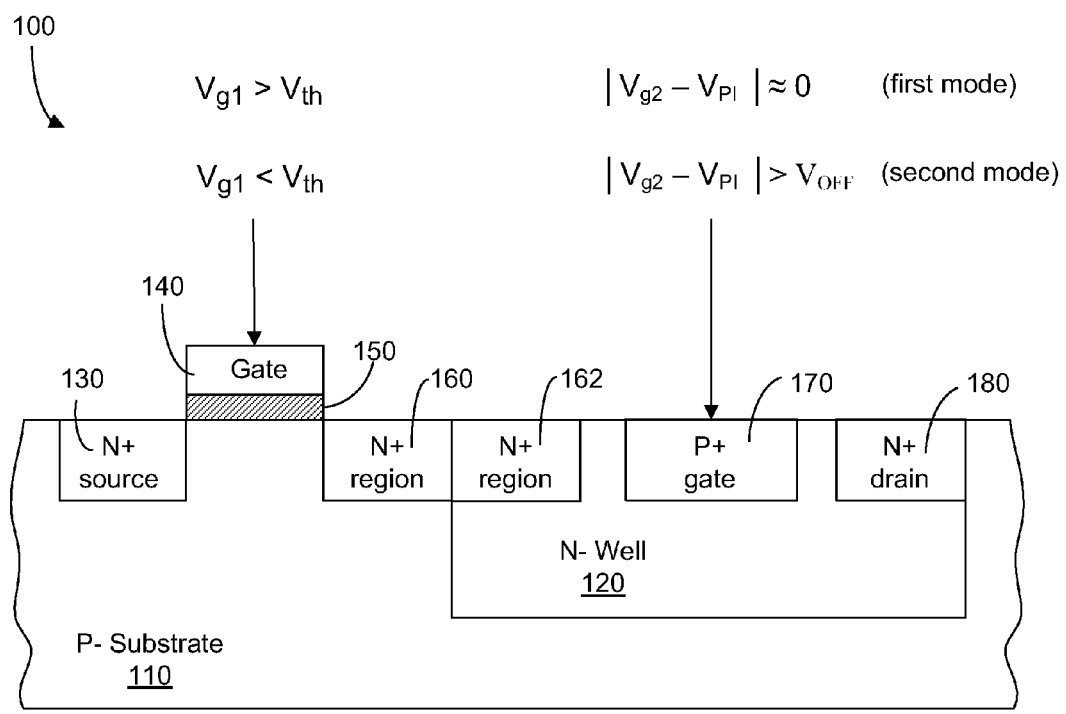
FIG. 1 illustrates an exemplary cross section of a double-gate semiconductor device comprising a MOS gate, a junction gate and two adjacent N+ regions, according to an embodiment of the present invention.

FIG. 1 illustrates an exemplary cross section of a double-gate semiconductor device comprising a MOS gate, a junction gate and two adjacent N+ regions (i.e., implantation regions). Double-gate semiconductor device 100 may be formed from regions and/or layers of doped silicon, polysilicon, metal, and insulating layers using semiconductor fabrication techniques known in the art. It will be understood that the term, "oxide layer," as used herein, is a term of art that refers to any suitable insulating layer for use as the barrier layer in the MOS device, whether or not it happens to include oxygen. This term of art came about because the layer was traditionally formed of silicon dioxide, but in more recent years has come to also be fabricated from other materials, such as low-k dielectric materials, some of which do not include oxygen.

Double-gate semiconductor device 100 comprises P− substrate 110, a N− well 120 formed in the P− substrate 110, N+ source 130, gate 140, oxide layer 150, N+ region 160, N+ region 162, P+ gate 170, and N+ drain 180. As used herein, the "+" symbol indicates strong doping of the conductivity type indicated (e.g., N+ indicating N type, strong doping) and the "−" symbol indicates weak doping of the conductivity type indicated (e.g., P− indicating P type, weak doping).

Electrical signals, such as $V_{g1}$ and control voltage $V_{g2}$, may be coupled to gate 140 and P+ gate 170, respectively. Electrical signals may also be coupled to N+ source 130, N+ region 160, N+ region 162 and N+ drain 180 using additional polysilicon layers (not shown) or metal layers (not shown) disposed on a surface of each of the N+ source 130, N+ region 160, N+ region 162 and N+ drain 180 using semiconductor fabrication techniques known in the art.

Double-gate semiconductor device 100 includes an N-type MOS Field Effect Transistor (also known as a N-channel MOSFET) formed by P− substrate 110, N+ source 130, and N+ region 160, gate 140, and oxide layer 150. The double-gate semiconductor device 100 also includes an N-channel Junction Field Effect Transistor (also known as an N-type JFET) formed by P− substrate 110, N− well 120, N+ region 162, P+ gate 170 and N+ drain 180. In this embodiment, N+ region 160 and N+ region 162 are adjacent and N+ region 162 is disposed substantially in N− well 120.

Alternatively, the elements of the double-gate semiconductor device 100 may be configured so that the double-gate semiconductor device 100 comprises a P-type MOS gate including a P-channel junction gate. In such an embodiment, some of the regions and/or layers of doped silicon may have a different doping, according to semiconductor fabrication techniques known in the art.

The double-gate semiconductor device 100 may be considered to operate in two modes. A first mode, illustrated in FIG. 1, is indicated by $V_{g1}$>a threshold voltage $V_{th}$ and $|V_{g2}-V_{PI}|\approx 0$ (i.e., the absolute value of $V_{g2}-V_{PI}$ is approximately 0). $V_{g1}$ is a voltage at the gate 140, $V_{g2}$ is a voltage at the P+ gate 170, $V_{th}$ is a threshold voltage for the gate 140, and $V_{PI}$ is a voltage at N+ region 162. In the first mode a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PI}$ of the N+ region 162. The P+ gate 170 thus presents a low resistance, $R_{on}$, to the current flow. In the first mode, the semiconductor device 100 conducts a current between N+ source 130 and N+ drain 180. In the second mode, the semiconductor device 100 does not conduct the current.

Returning to FIG. 1, in the second mode a negative control voltage $V_{g2}$ is applied to P+ gate 170 and the depletion region under P+ gate 170 extends into a channel (not shown) in N− well 120. When the control voltage $V_{g2}$ applied to P+ gate 170 is such that $|V_{g2}-V_{PI}|$ is greater than a pinch off voltage, $V_{off}$, the channel is fully depleted under the P+ gate 170 and no current flows between the N+ region 162 and N+ drain 180. Likewise, in the second mode, no current flows between N+ source 130 and N+ drain 180.

When a control voltage $V_{g2}$ is applied to P+ gate 170 such that $|V_{g2}-V_{PI}|\approx 0$ (corresponding to the first mode), the channel is open and a current of majority carriers may flow between N+ region 162 and N+ drain 180. The P+ gate 170 (the junction gate) may, therefore, behave equivalently to a variable resistor with a high effective resistance, $R_{off}$, that allows little or no current flow between N+ source 130 and N+ drain 180 when $|V_{g2}-V_{PI}|>V_{off}$, and a low effective resistance, $R_{on}$, allowing maximum current flow when $|V_{g2}-V_{PI}|\approx 0$.

The double-gate semiconductor device 100 may include a device with a double gate in which the control voltage $V_{g2}$ at P+ gate 170 (the junction gate) may be a function of the voltage $V_{g1}$ at gate 140 (the MOS gate). The MOS gate and the junction gate may both be dynamically biased in the "on"

state or "off" state at the same time using a control circuitry described with reference to FIG. 5.

The high effective resistance, $R_{off}$, in the second mode of operation allows the P+ gate 170 to sustain a high voltage and limits the voltage potential between gate 140 and N+ region 160 to less than the MOS gate breakdown voltage. Because the breakdown voltage of the double-gate semiconductor device 100 is the sum of the breakdown voltages of the MOS gate and the P+ gate 170, the intrinsically high breakdown voltage of the P+ gate 170 provides the high breakdown voltage of the double-gate semiconductor device 100.

The control voltage $V_{g2}$ may be adjusted using the control circuitry and may depend on the pinch-off voltage, $V_{off}$. The control circuitry may comprise a capacitor (not shown) configured to couple a RF signal from gate 140 to P+ gate 170. To limit the distance between gate 140 and P+ gate 170, the capacitor may be implemented with multiple stacked metal layers in parallel between the gate 140 and P+ gate 170.

Figure 2:
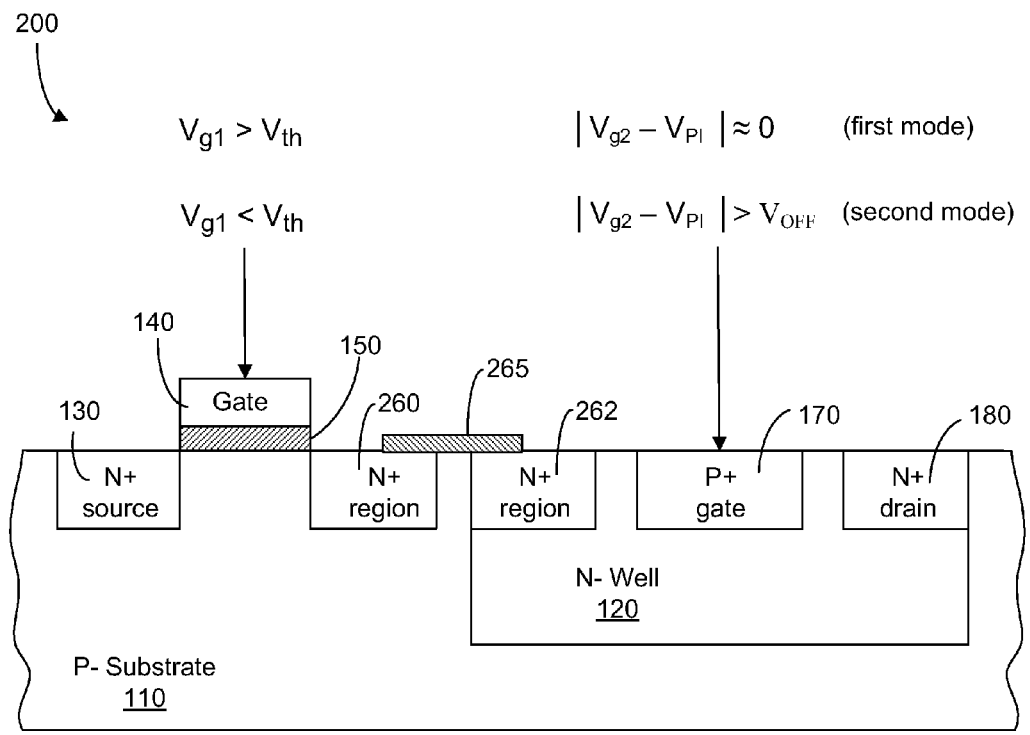
FIG. 2 illustrates an exemplary cross section of a double-gate semiconductor device comprising a MOS gate, a junction gate and two N+ regions coupled using a conducting layer, according to an embodiment of the present invention.

FIG. 2 illustrates an exemplary cross section of a double-gate semiconductor device comprising a MOS gate, a junction gate and two N+ regions coupled using a conducting layer. Double-gate semiconductor device 200 may be formed from regions and/or layers of doped silicon, polysilicon, metal, and insulating layers using semiconductor fabrication techniques known in the art.

Double-gate semiconductor device 200 comprises P− substrate 110, a N− well 120 formed in the P− substrate 110, N+ source 130, gate 140, oxide layer 150, N+ region 260, N+ region 262, conducting layer 265, P+ gate 170, and N+ drain 180. Conducting layer 265 may be a polysilicon layer, a metal layer or another conducting layer known in the art. As illustrated in FIG. 2, N+ region 260 and N+ region 262 are separated by a region of P− substrate 110, and N+ region 262 is disposed substantially in N− well 120.

As discussed herein with respect to double-gate semiconductor device 200, electrical signals, such as $V_{g1}$ and control voltage $V_{g2}$, may be coupled to gate 140 and P+ gate 170, respectively. Electrical signals may also be coupled to N+ source 130, N+ region 260, N+ region 262 and N+ drain 180 using additional polysilicon layers (not shown) or metal layers (not shown) disposed on a surface of each of the N+ source 130, N+ region 260, N+ region 262 and N+ drain 180 using semiconductor fabrication techniques known in the art.

Double-gate semiconductor device 200 includes an N-type MOSFET formed by P− substrate 110, N− well 120, N+ source 130, and N+ region 260, gate 140, and oxide layer 150. The double-gate semiconductor device 200 also includes an N-channel JFET formed by P− substrate 110, N− well 120, N+ region 262, P+ gate 170 and N+ drain 180. In this embodiment, N+ region 260 and N+ region 262 are coupled using conducting layer 265.

Alternatively, the elements of the double-gate semiconductor device 200 may be configured so that the double-gate semiconductor device 200 comprises a P-type MOS gate including a P-channel junction gate or an N-type MOS gate including a P-channel junction gate or a P-type MOS gate including a N-channel junction gate. In such an embodiment, some of the regions and/or layers of doped silicon may have a different doping, according to semiconductor fabrication techniques known in the art.

The double-gate semiconductor device 200 may be considered to operate analogously to the two modes as described herein with respect to FIG. 1. A first mode is indicated by $V_{g1}>$a threshold voltage $V_{th}$ and $|V_{g2}-V_{PJ}|\approx 0$, where $V_{PJ}$ is a voltage at N+ region 262. In the first mode, a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PJ}$ of the N+ region 262. The P+ gate 170 thus presents a low resistance, $R_{on}$, to the current flow. In the first mode, the semiconductor device 200 conducts a current between N+ source 130 and N+ drain 180. In the second mode, the semiconductor device 200 does not conduct the current.

When a control voltage $V_{g2}$ is applied to P+ gate 170 such that $|V_{g2}-V_{PJ}|\approx 0$ (corresponding to the first mode), the channel is open and a current of majority carriers may flow between N+ region 262 and N+ drain 180. The P+ gate 170 (the junction gate) may, therefore, behave equivalently to a variable resistor with a high effective resistance, $R_{off}$, that allows little or no current flow between N+ source 130 and N+ drain 180 when $|V_{g2}-V_{PJ}|>V_{off}$, and a low effective resistance, $R_{on}$, allowing maximum current flow when $|V_{g2}-V_{PJ}|\approx 0$.

The double-gate semiconductor device 200 may include a device with a double-gate in which the control voltage $V_{g2}$ at P+ gate 170, the junction gate, may be a function of the voltage $V_{g1}$ at gate 140. The MOS gate and the junction gate may both be dynamically biased in the "on" state or "off" state at the same time using a control circuitry described with reference to FIG. 5. The control circuitry may include a capacitor (not shown) configured to couple a RF signal from gate 140 to P+ gate 170, as described with reference to FIG. 1.

In the second mode of operation, the high effective resistance, $R_{off}$, allows the P+ gate 170 to sustain a high voltage and limits the voltage potential between gate 140 and N+ region 260 to less than the MOS gate breakdown voltage. Because the breakdown voltage of the double-gate semiconductor device 200 is the sum of the breakdown voltages of the MOS gate and the P+ gate 170, the intrinsically high breakdown voltage of the P+ gate 170 provides the high breakdown voltage of the double-gate semiconductor device 200.

Figure 3:
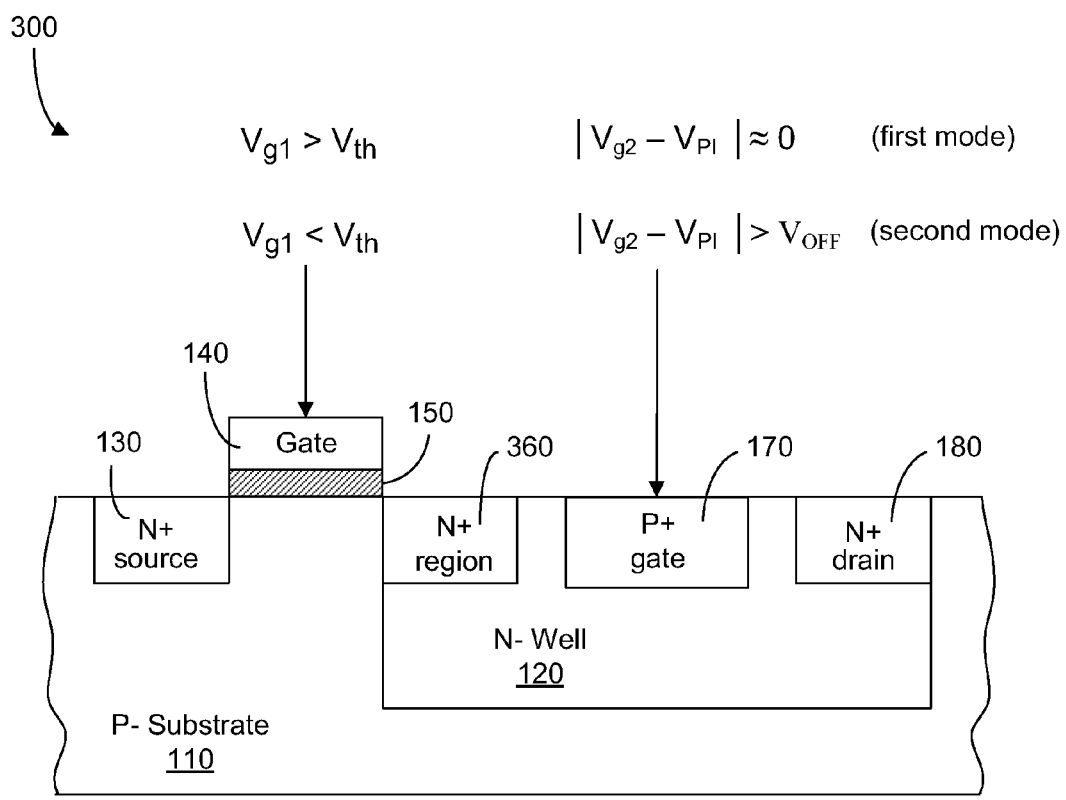
FIG. 3 illustrates an exemplary cross section of a double-gate semiconductor device comprising a MOS gate, a junction gate, and a single N+ region disposed between the MOS gate and the junction gate, according to an embodiment of the present invention.

FIG. 3 illustrates an exemplary cross section of a double-gate semiconductor device comprising a MOS gate and a junction gate and a single N+ region disposed between the MOS gate and the junction gate. Double-gate semiconductor device 300 may be formed from regions and/or layers of doped silicon, polysilicon, metal, and insulating layers using semiconductor fabrication techniques known in the art. Double-gate semiconductor device 300 comprises P− substrate 110, a N− well 120 formed in the P− substrate 110, N+ source 130, gate 140, oxide layer 150, N+ region 360, P+ gate 170, and N+ drain 180. As illustrated in FIG. 3, N+ region 360 is disposed substantially in the N− well 120.

As described with reference to FIGS. 1-2, electrical signals, such as $V_{g1}$ and control voltage $V_{g2}$, may be coupled to gate 140 and P+ gate 170, respectively. Electrical signals may also be coupled to N+ source 130, N+ region 360 and N+ drain 180 using additional polysilicon layers (not shown) or metal layers (not shown) disposed on a surface of each of the N+ source 130, N+ region 360 and N+ drain 180 using semiconductor fabrication techniques known in the art.

Double-gate semiconductor device 300 includes an N-type MOS gate formed by P− substrate 110, gate 140, and oxide layer 150. The double-gate semiconductor device 300 also includes an N-channel JFET formed by P− substrate 110, N− well 120, N+ region 360, P+ gate 170 and N+ drain 180. In this embodiment, the N+ region 360 is a source of the N-channel JFET and abuts the N-type MOS gate, the N-type MOS gate comprising gate 140 and oxide layer 150.

The double-gate semiconductor device 300 may be considered to operate analogously to the two modes as described herein with respect to FIGS. 1-2. A first mode is indicated by $V_{g1}$>a threshold voltage $V_{th}$ and $|V_{g2}-V_{PJ}|\approx 0$, where $V_{PJ}$ is a voltage at N+ region 360. In the first mode a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PJ}$ of the N+ region 360. The P+ gate 170 thus presents a low resistance, $R_{on}$, to the current flow. In the first mode, the semiconductor device 300 conducts a current between N+ source 130 and N+ drain 180. In the second mode, the semiconductor device 300 does not conduct the current.

When a control voltage $V_{g2}$ is applied to P+ gate 170 such that $|V_{g2}-V_{PJ}|\approx 0$ (corresponding to the first mode), the channel is open and a current of majority carriers may flow between N+ region 360 and N+ drain 180. The P+ gate 170 (the junction gate) may, therefore, be considered as behaving equivalently to a variable resistor with a high effective resistance, $R_{off}$, that allows little or no current flow between N+ source 130 and N+ drain 180 when $|V_{g2}-V_{PJ}|>V_{off}$, and a low effective resistance, $R_{on}$, allowing maximum current flow when $|V_{g2}-V_{PJ}|\approx 0$.

As described with reference to FIGS. 1-2, the double-gate semiconductor device 300 may be considered to be a device with a double-gate in which the control voltage $V_{g2}$ at P+ gate 170, the junction gate, may be a function of the voltage $V_{g1}$ at gate 140. The MOS gate and the junction gate may both be dynamically biased in the "on" state or "off" state at the same time using a control circuitry described with reference to FIG. 5. The control circuitry may comprise a capacitor (not shown) configured to couple a RF signal from gate 140 to P+ gate 170, as described with reference to FIG. 1.

In the second mode of operation, the high effective resistance, $R_{off}$, allows the P+ gate 170 to sustain a high voltage and limits the voltage potential between gate 140 and N+ region 360 to less than the MOS gate breakdown voltage. Because the breakdown voltage of the double-gate semiconductor device 300 is the sum of the breakdown voltages of the MOS gate and the P+ gate 170, the intrinsically high breakdown voltage of the P+ gate 170 provides the high breakdown voltage of the double-gate semiconductor device 300.

Figure 4:
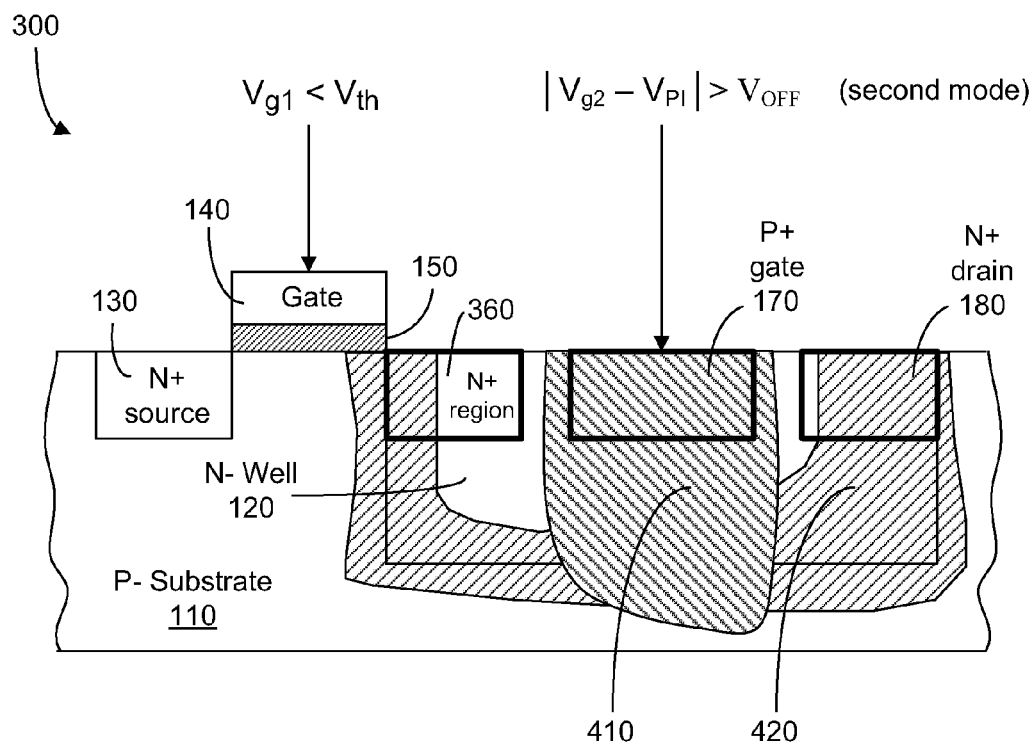
FIG. 4 illustrates an exemplary cross section of the double-gate semiconductor device of FIG. 3 in a second mode of operation, according to an embodiment of the present invention.

FIG. 4 illustrates an exemplary cross section of the double-gate semiconductor device 300 of FIG. 3 in a second mode of operation. The description herein of the double gate semiconductor device 300 in a second mode of operation applies analogously to the second mode of operation of the double-gate semiconductor devices 100 and 200 described with reference to FIGS. 1-2, respectively.

In the second mode of operation, the voltage $V_{g1}$ applied to gate 140 is lower than the threshold voltage, $V_{th}$, so that the MOS gate is "off." A control voltage $V_{g2}$ is applied to the P+ gate 170 so that the junction gate is biased near the pinch-off voltage, $V_{off}$, by using a high potential difference between $V_{g2}$ and a voltage $V_{PJ}$ of the N+ region 360. The P+ gate 170 thus presents a high effective resistance, $R_{off}$, to the current flow in a drift region, such as drift region 420 illustrated in FIG. 4. The high effective resistance, $R_{off}$, results from a depletion region extending under and around the P+ gate 170, such as depletion region 410 illustrated in FIG. 4.

The high effective resistance, $R_{off}$, in the second mode of operation allows the P+ gate 170 to sustain a high voltage and limits the voltage swing at gate 140 to less than the MOS gate breakdown voltage. The second mode of operation effectively protects the gate 140 from voltages greater than the breakdown voltage. Because the breakdown voltage of the double-gate semiconductor device 300 is the sum of the breakdown voltages of the MOS gate and the P+ gate 170, the intrinsically high breakdown voltage of the P+ gate 170 provides the high breakdown voltage of the double-gate semiconductor device 300.

Figure 5:
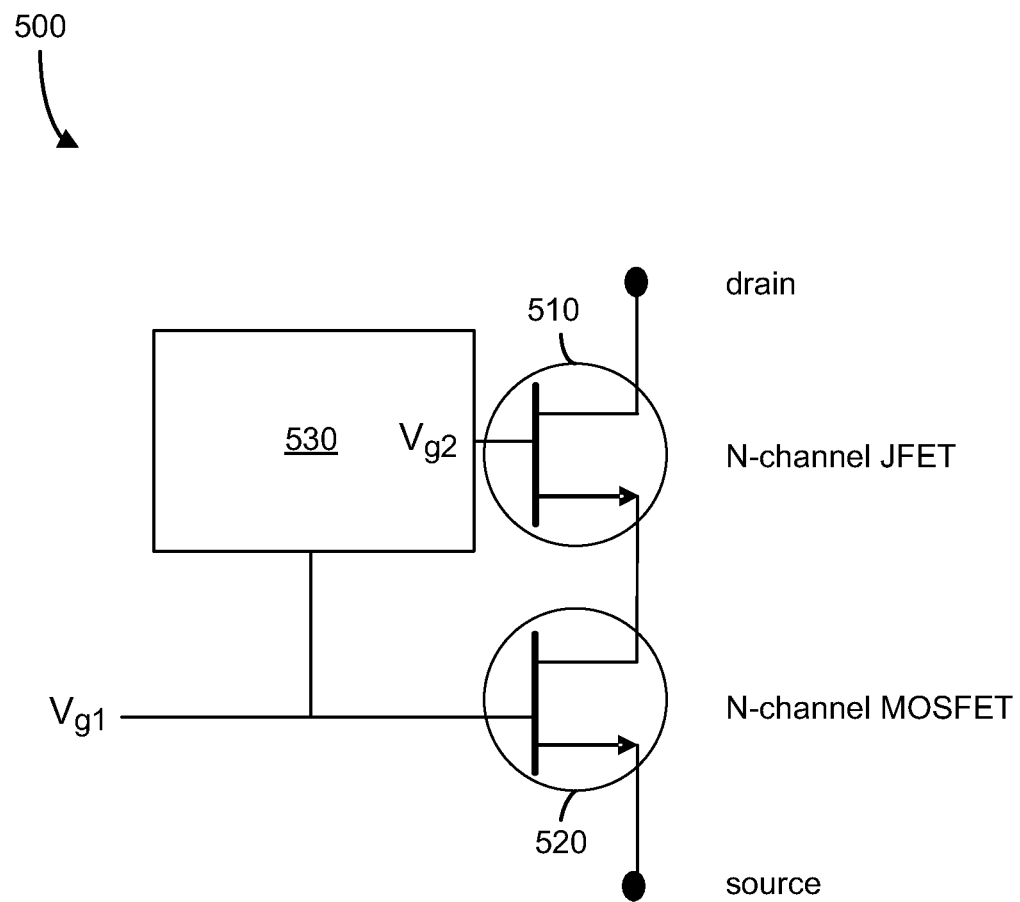
FIG. 5 illustrates an exemplary circuit diagram of the double-gate semiconductor devices of FIGS. 1-3 and 6, according to an embodiment of the present invention.

FIG. 5 illustrates an exemplary circuit diagram of the double-gate semiconductor devices of FIGS. 1-2. The circuit 500 comprises N-channel JFET 510, N-channel MOSFET 520, and control circuitry 530. The control circuitry 530 provides a control voltage $V_{g2}$ to the gate of N-channel JFET 510 that may be a function of the voltage $V_{g1}$ of the N-channel MOSFET 520. The control circuitry 530 functions to dynamically bias both the N-channel MOSFET 520 and N-channel JFET 510 in the "on" state or the "off" state at the same time. Control circuitry 530 may be a capacitor that may couple a RF signal from the gate of the N-channel MOSFET to the gate of the N-channel JFET.

The control circuitry 530 provides the control voltage $V_{g2}$ to bias N-channel JFET 510 so that the $R_{off}$ effective resistance is a maximum value when the N-channel MOSFET is "off" (i.e., $V_{g1}<V_{th}$). Typically, the control voltage $V_{g2}$ biases N-channel JFET 510 close to the pinch-off voltage, $V_{off}$. When the N-channel MOSFET 520 is "on" (i.e., $V_{g1}>V_{th}$), then control circuitry 530 provides the control voltage $V_{g2}$ to bias N-channel JFET 510 so that the $R_{on}$ effective resistance is minimal and the current flow is a maximum. A large range of $R_{on}$ to $R_{off}$ effective resistance variation allows a large excursion of voltage at the drain of the N-channel JFET 510 and a corresponding high power capability for the double-gate semiconductor devices described with reference to FIGS. 1-2. The double-gate semiconductor devices described with reference to FIGS. 1-2 may also be represented by a circuit diagram similar to circuit 500 in which N-channel junction gate 510 may be substituted with a P-channel junction gate (not shown) and N-channel MOS gate 520 may be substituted with a P-channel MOS gate (not shown).

Figure 6:
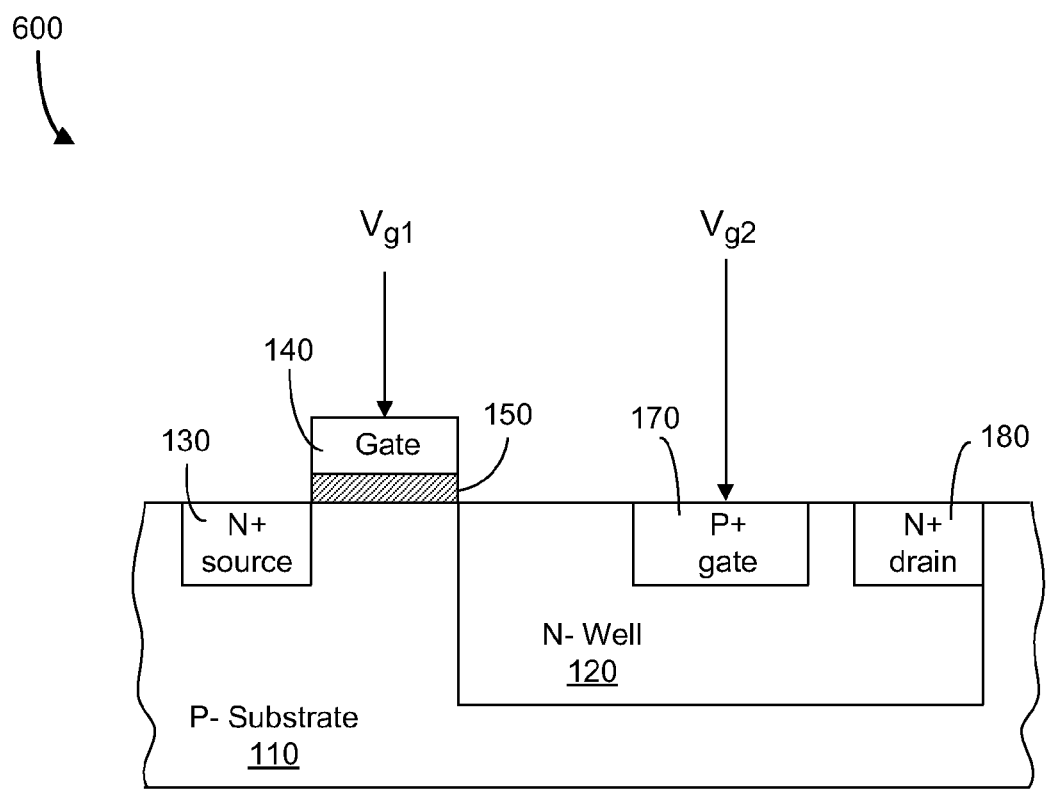
FIG. 6 illustrates an exemplary cross section of a double-gate semiconductor device comprising a MOS gate and a junction gate, according to an embodiment of the present invention.

FIG. 6 illustrates a cross section of a double-gate semiconductor device, according to an alternative embodiment of the invention. In this embodiment, the double-gate semiconductor device 600 may be fabricated in a higher spatial density configuration than the embodiments described with reference to FIGS. 1-4. As illustrated in FIG. 6, double-gate semiconductor device 600 does not include a N+ region such as the N+ region 160, N+ region 162, N+ region 260, N+ region 262 and N+ region 360 described with reference to FIGS. 1-4. Thus, the double-gate semiconductor device 600 is fabricated without the common implantation of an N+ region between the MOS gate and the junction gate. The principle of operation of the double-gate semiconductor device 600 is analogous to the principles of operation of the double-gate semiconductor devices 100, 200 and 300 described with reference to FIGS. 1-3, including the description of the second mode of operation described with reference to FIG. 4.

Double-gate semiconductor device 600 may be formed from regions and/or layers of doped silicon, polysilicon, metal, and insulating layers using semiconductor fabrication techniques known in the art. The double-gate semiconductor device 600 comprises P– substrate 110, a N– well 120 formed in the P– substrate 110, N+ source 130, gate 140, oxide layer 150, P+ gate 170 and N+ drain 180.

Electrical signals, such as $V_{g1}$ and control voltage $V_{g2}$, may be coupled to gate 140, and P+ gate 170, respectively. Electrical signals may be coupled to N+ source 130 and N+ drain 180 using additional polysilicon layers (not shown) or metal layers (not shown) disposed on a surface of each of the N+ source 130 and N+ drain 180 using semiconductor fabrication techniques known in the art.

The double-gate semiconductor device 600 may be considered to operate analogously to the two modes of operation described with reference to FIGS. 1-4. In a first mode, a current conducts between N+ source 130 and N+ drain 180. In a second mode, the current does not conduct. In the first mode, a voltage $V_{g1}$ is applied to gate 140 that is greater than a threshold voltage $V_{th}$ (not shown). A control voltage $V_{g2}$ is applied to the P+ gate 170, thus presenting a low effective resistance, $R_{on}$, to the current flow.

In the second mode of operation, the voltage $V_{g1}$ applied to gate 140 is lower than a threshold voltage, $V_{th}$ and a control voltage $V_{g2}$ is applied P+ gate 170, thus presenting a high effective resistance, $R_{off}$, to the current flow. The high effective resistance, $R_{off}$, results from a depletion region, similar to the depletion region 410 described with reference to FIG. 4, that extends under and around P+ gate 170.

Figure 7:
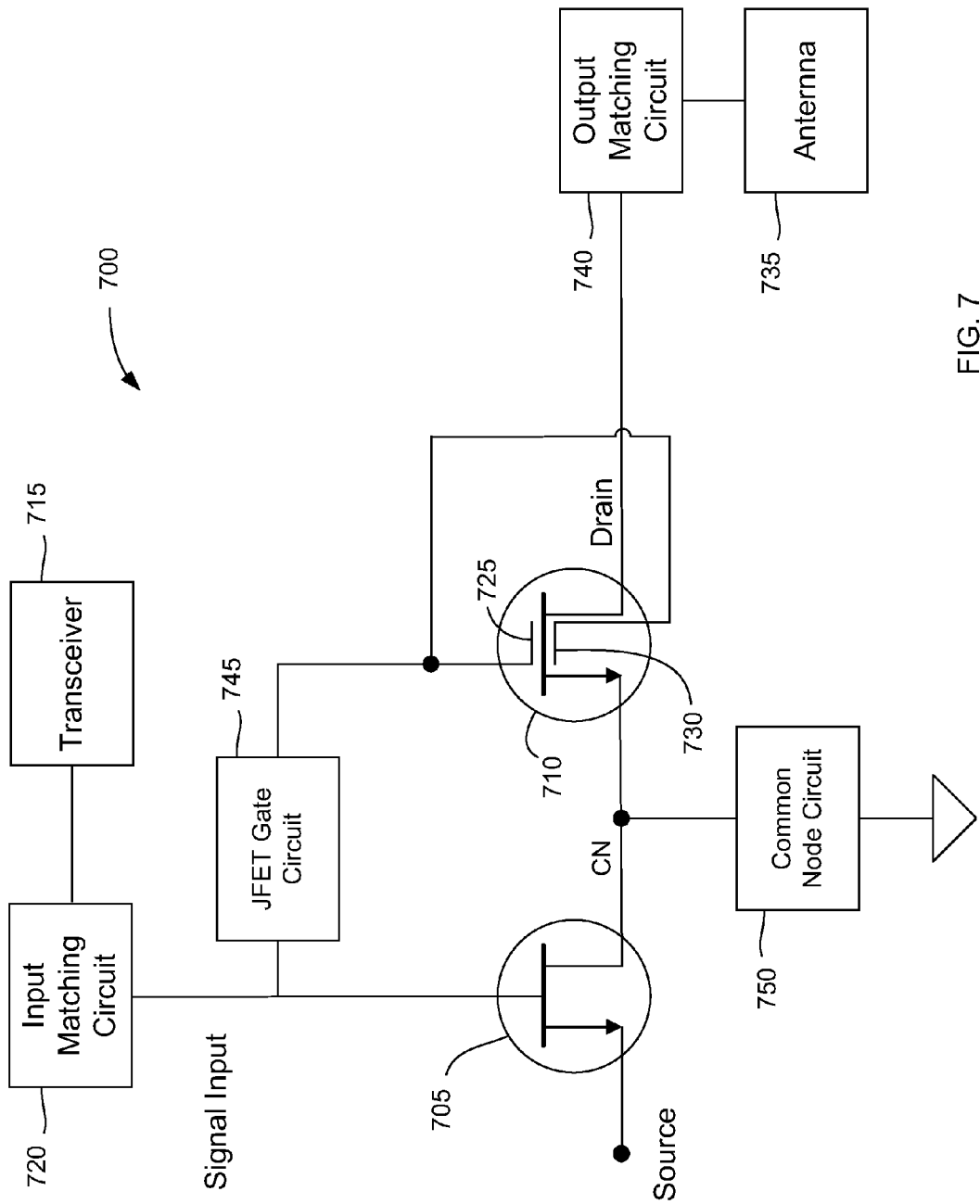
FIG. 7 provides a circuit diagram for an exemplary electronic circuit comprising a MOSFET and a dual-gate JFET, according to an embodiment of the present invention.

FIG. 7 provides a circuit diagram for an exemplary electronic circuit 700 for amplifying an input signal such as an RF signal. The electronic circuit 700 comprises a MOSFET 705 and a dual-gate JFET 710 in a cascode configuration. In the circuit 700 the JFET 710 functions as a variable resistor.

The MOSFET 705 and dual-gate JFET 710 are distinct transistors. As used herein, two transistors are defined as distinct unless the transistors share a common implantation region. As an example, N+ regions 260 and 262 (FIG. 2) are drain and source, respectively, of distinct transistors. As another example, N+ regions 160 and 162 (FIG. 1) are drain and source, respectively, of transistors that are not distinct since the two share a N+ implantation region.

The MOSFET 705 includes a drain and a source, and in operation the source is coupled to a power supply such as $V_{DD}$. The MOSFET 705 is controlled by a gate which, in operation, receives an input signal, for example an RF signal, from a signal source such as transceiver 715. Various embodiments of circuit 700 include an input matching circuit 720 between the transceiver 715 and the gate of the MOSFET 705 to match the impedances on either side thereof. An exemplary matching circuit 720 comprises a capacitor and an inductor where the capacitor is coupled between ground and a node between the transceiver 715 and the gate of the MOSFET 705, and the inductor is disposed in-line between the node and the gate of the MOSFET 705. In various embodiments the gate length of the MOSFET 705, i.e. the length of the gate implant located between the source and the drain, is less than one micron. It is noted that gate width is the dimension of the gate in the plane of the substrate measured perpendicular to the gate length. In various embodiments, the MOSFET 705 can be a NMOSFET or a PMOSFET.

The signal source, such as transceiver 715, is disposed on the same substrate as the MOSFET 705 and the dual-gate JFET 710, in some embodiments. In further embodiments, the signal source produces a signal with a frequency in the range of about 700 MHz to about 2.5 GHz. In further embodiments, the signal source produces a signal with a frequency in the range of about 150 MHz to about 6 GHz.

The dual-gate JFET 710 comprises a source and a drain electrically connected by a channel that is controlled by two gates, a top gate 725 and a bottom gate 730 disposed above and below the channel, respectively. In various embodiments, the dual gate JFET 710 can be a NJFET or a PJFET. In various embodiments the dual-gate JFET 710 comprises a sub-micron gate length. The drain of the dual-gate JFET 710 is coupled to an antenna 735 or another device configured for signal transmission. In some embodiments the antenna 735 is coupled to the drain of the dual-gate JFET 710 by an output matching circuit 740 formed with passive networks, also provided to match impedances.

The source of the dual-gate JFET 710 is coupled to the drain of the MOSFET 705. In some embodiments, the source of the dual-gate JFET 710 is directly coupled to the drain of the MOSFET 705. As used herein, "directly coupled" means that there are no active components in electrical communication between the coupled transistors. In some embodiments, the source of the dual-gate JFET 710 is coupled to the drain of the MOSFET 705 through vias and a trace such as conducting layer 265 (FIG. 2). In some embodiments a point between the source of the dual-gate JFET 710 and the drain of the MOSFET 705 comprises a common node (CN) point. As shown in FIG. 7, the electronic circuit 700 can also comprise, in some instances, an optional common node circuit 750 coupled between the common node point and ground.

As noted above, the JFET 710 is controlled by a top gate 725 and a bottom gate 730. In various embodiments, the top and bottom gates 725, 730 are dependent (e.g. commonly controlled) or independent, and can be controlled by ground, a DC bias, the input signal applied to the gate of the MOSFET 705, or the input signal plus a DC bias. Various exemplary ways to control the top and bottom gates 725, 730 are discussed with reference to FIGS. 9-15. In the example provided by FIG. 7, the top and bottom gates 725, 730 are commonly controlled by the output of an optional JFET gate circuit 745 which is analogous to control circuit 530 (FIG. 5).

The JFET gate circuit 745 serves to improve the performance of embodiments of the invention that are used as a power amplifier. The bias of the bottom gate 730 determines the voltage of the top gate 725 to pinch off the JFET 710 where the pinch-off voltage of the JFET 710 is the limit value for the drain of the MOSFET 705. An appropriate value for the bottom gate 730 bias is one that allows that the pinch-off voltage of the JFET 710 to protect the MOSFET 705 in its reliable zone. In some embodiments the top gate 725 of the JFET 710 is maintained at 0V. But the large gate-to-source and gate-to-drain capacitances couple the large voltage of the drain and of the source onto the gate voltage, reducing the efficiency of the $R_{off}$ and $R_{on}$ variation of the JFET 710. The function of the JFET gate circuit 745 is to cancel these signals on the top gate 725 by applying an opposing signal.

As shown in FIG. 7, the electronic circuit 700 can also comprise, in some instances, an optional common node circuit 750 coupled between the common node point and ground. The common node circuit 750 also serves to improve the performance of embodiments of the invention that are used as a power amplifier. The common node circuit 750 compensates for the effect of the gate-to-drain capacitance of the MOSFET 705 and the gate-to-source capacitance of the JFET 710. The common node circuit 750 can be, in some embodiments, a single inductance or a serial inductor-capacitor (LC) network configured to resonate with the noted capacitances of the MOSFET 705 and the JFET 710 at the particular frequency.

Figure 8A:
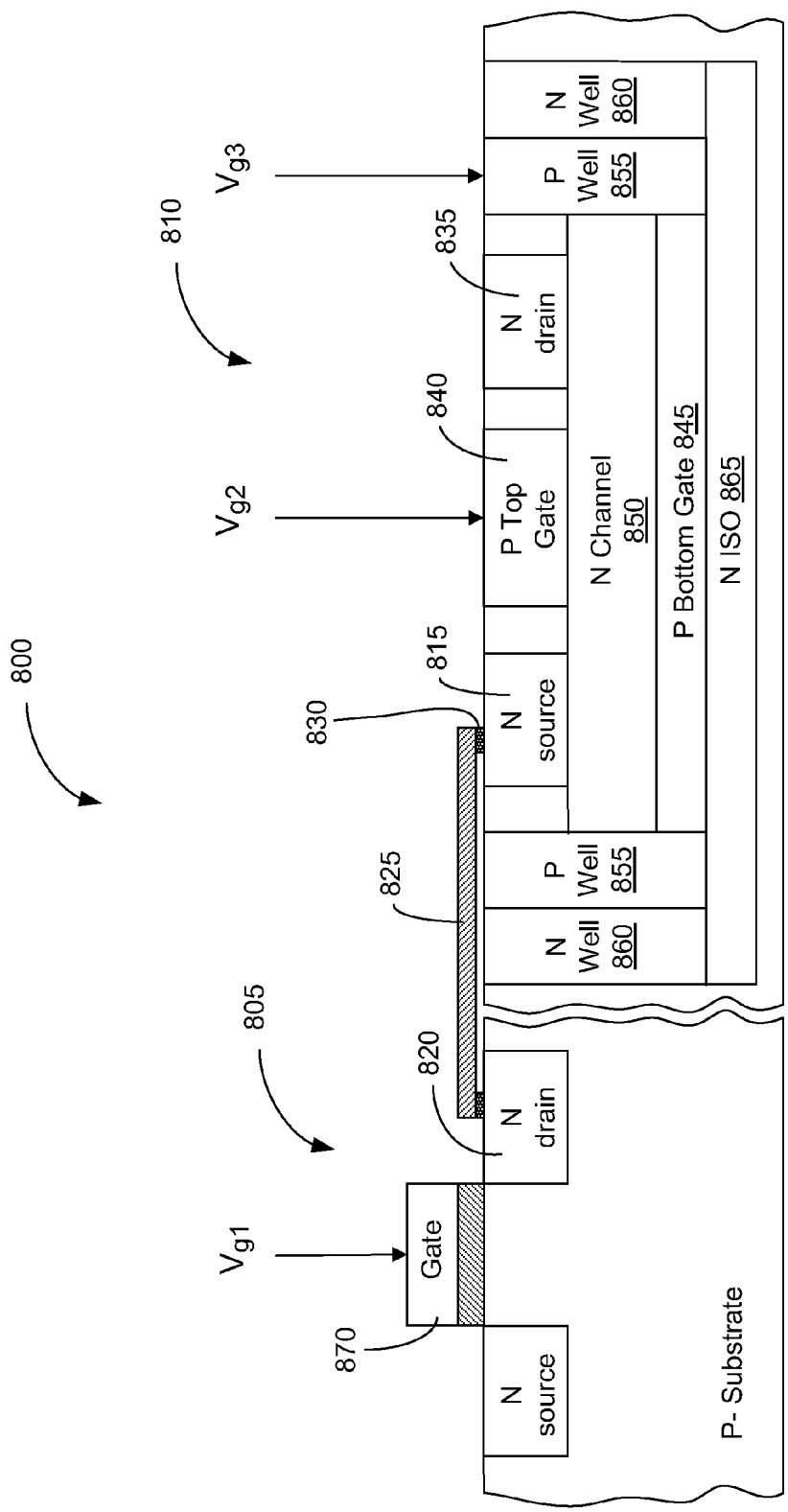
FIGS. 8A, 8B, and 8C are cross sections of exemplary electronic circuits, each comprising a MOSFET and a dual-gate JFET where the MOSFET and the JFET are distinct, according to three embodiments of the present invention.

FIG. 8A provides a cross section of an exemplary electronic circuit 800 comprising a MOSFET 805 and a dual-gate JFET 810 where the MOSFET 805 and the JFET 810 comprise distinct transistors. As in previous embodiments, the MOSFET 805 and the dual-gate JFET 810 can be formed from regions and/or layers of doped silicon, polysilicon, various metals, and various insulating layers using semiconductor fabrication techniques known in the art. In this example, a source 815 of the dual-gate JFET 810 is directly coupled to a drain 820 of the MOSFET 805 by a metal layer 825 and vias 830. As distinct transistors, the MOSFET 805 and a dual-gate JFET 810 can be implemented at different locations on the same substrate and with different dimensions, such as different widths.

The JFET 810 additionally comprises a drain 835, a top gate 840, and a bottom gate 845. The top gate 840 and bottom gate 845 are disposed above and below an N channel 850 that couples the source 815 to the drain 820 of the JFET 810. The bottom gate 845 is bounded by two P wells 855 that provide an electrical connection to the bottom gate 845. The JFET 810 is disposed within an N well region that comprises two N wells 860 and an N isolation layer 865. The P wells 855 also serve to isolate the N channel 850 from the N wells 860 in these embodiments.

As shown in FIG. 8A, a gate 870 of the MOSFET 805 is controlled by a signal $V_{g1}$. Similarly, the top gate 840 and bottom gate 845 of the JFET 810 are controlled by signals $V_{g2}$ and $V_{g3}$, respectively. As noted above, the signal $V_{g2}$ may be dependent upon, or independent of, the signal $V_{g1}$. Additionally, the signal $V_{g3}$ may be dependent upon, or independent of, the signal $V_{g2}$.

Figure 8B:
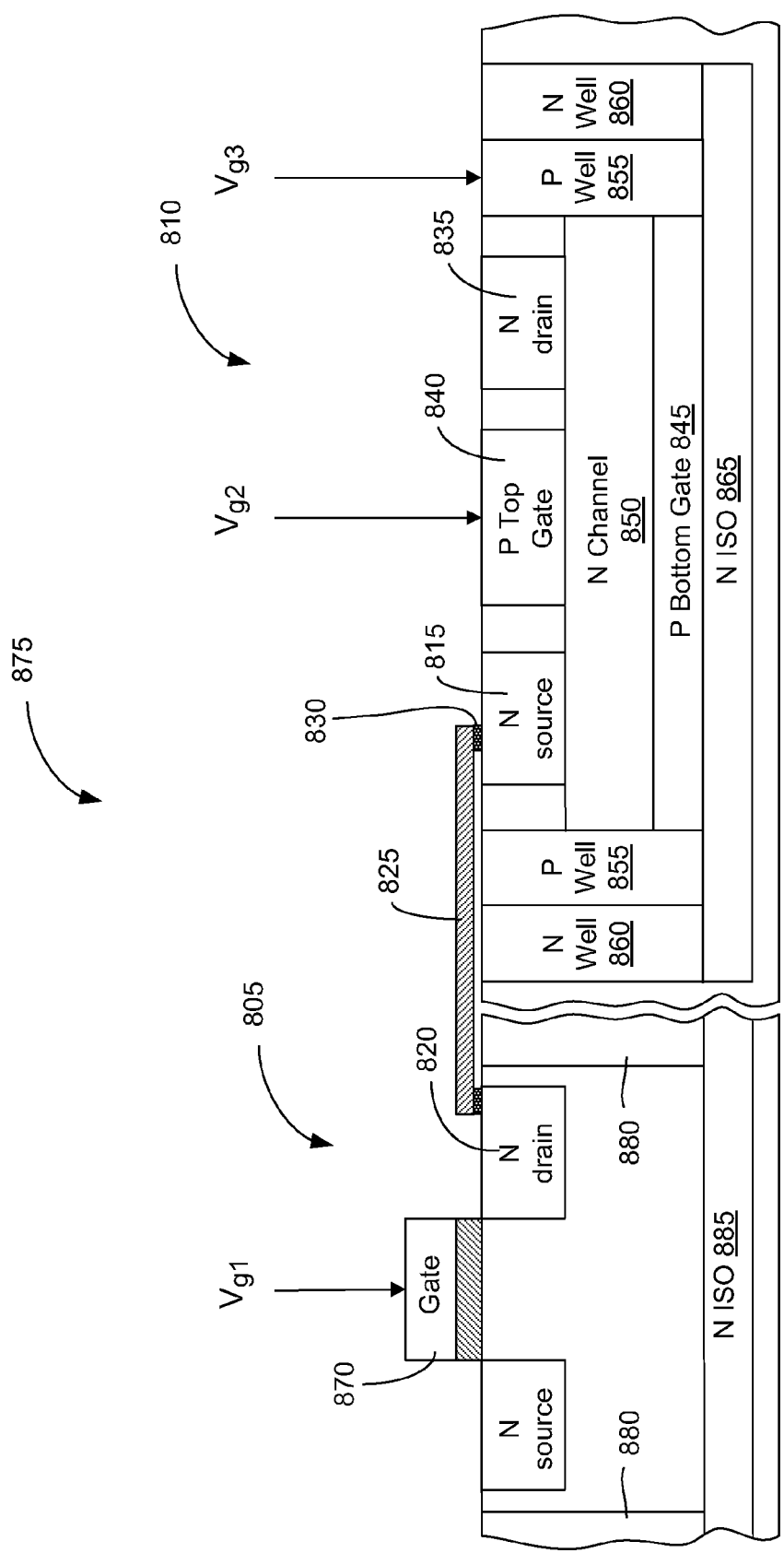

FIG. 8B provides a cross section of another exemplary electronic circuit 875 comprising a MOSFET 805 and a dual-gate JFET 810 where the MOSFET 805 and the JFET 810 comprise distinct transistors. In circuit 875 each of the MOSFET 805 and the dual-gate JFET 810 are disposed within separate N well regions. Here, the N well region within which the MOSFET 805 is disposed is bounded by two N wells 880 and an N isolation layer 885. These embodiments advantageously isolate the MOSFET 805 from the substrate of the JFET 810.

Figure 8C:
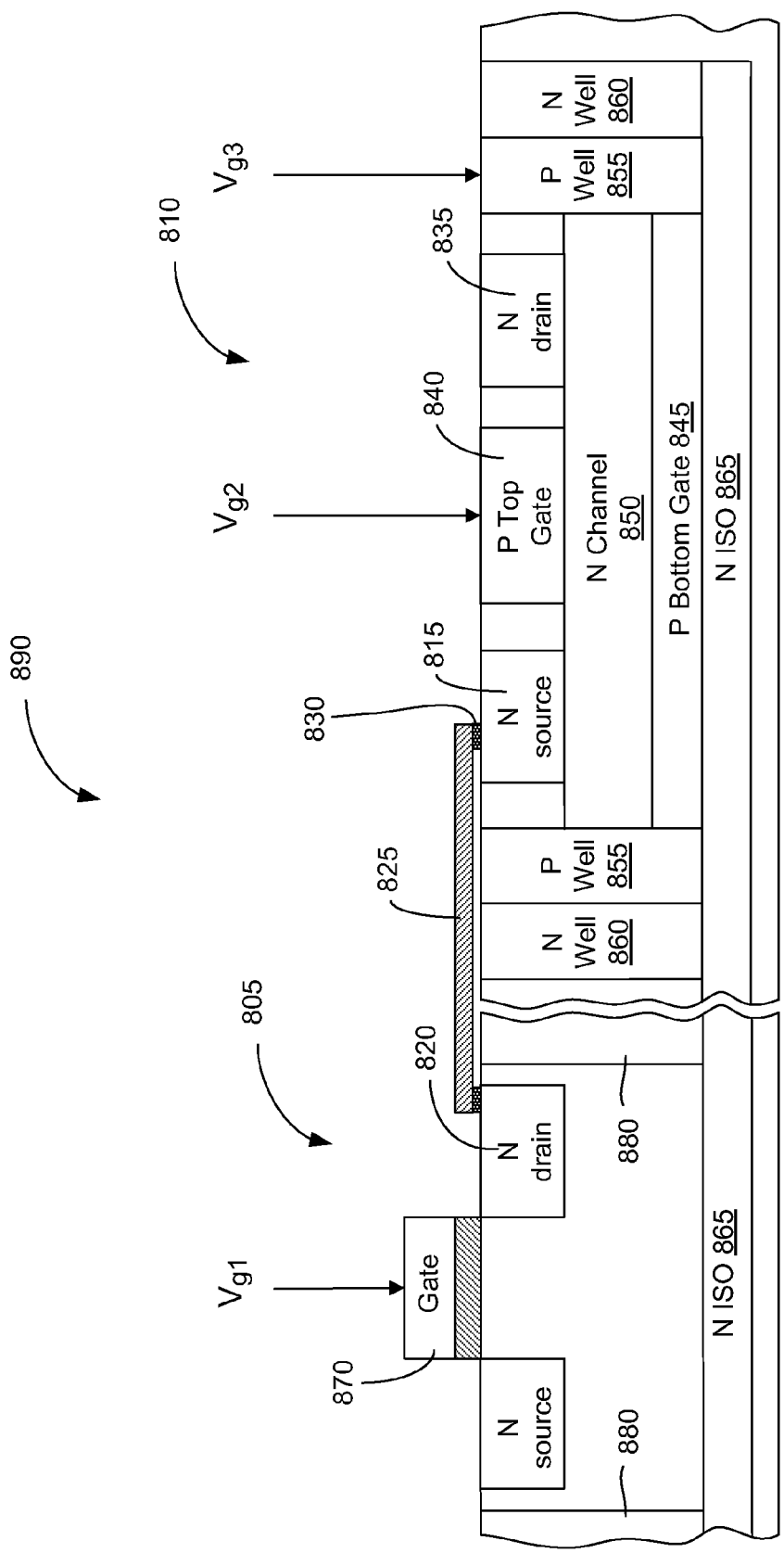

FIG. 8C provides a cross section of another exemplary electronic circuit 890 comprising a MOSFET 805 and a dual-gate JFET 810 where the MOSFET 805 and the JFET 810 comprise distinct transistors. Electronic circuit 890 in FIG. 8C differs from electronic circuit 875 in FIG. 8B in that the N isolation layer 865 is continuous across the entire substrate. Here, the N well region within which the MOSFET 805 is disposed is bounded by the two N wells 880 and the same N isolation layer 865 as bounds the well of the JFET 810.

Embodiments of electronic circuits illustrated by FIG. 8C can be produced, for example, starting with a substrate having an embedded N isolation layer 865. The substrate can be formed by growing an oxide layer on one surface of a wafer, bonding a second wafer to that surface, and then lapping back the second wafer towards the oxide layer until a desired material thickness above the N isolation layer 865 is achieved; such substrates are commonly referred to as silicon on insulator (SOI) wafers. Various features of the MOSFET 805 and JFET 810 that are defined within the substrate are then formed by ion implantation techniques progressing from the deeper features to the more shallow features. Features formed on the substrate like metal line 825 and gate 870 can be formed by photolithography methods, for example. The embodiments of electronic circuits illustrated by FIGS. 8A and 8B can be produced, for example, by forming N isolation layer 865 and optionally N isolation layer 885 by ion implantation followed by the formation of the remaining features defined within the substrate by ion implantation and then followed by the formation of those features formed on the substrate by photolithography.

Figure 9:
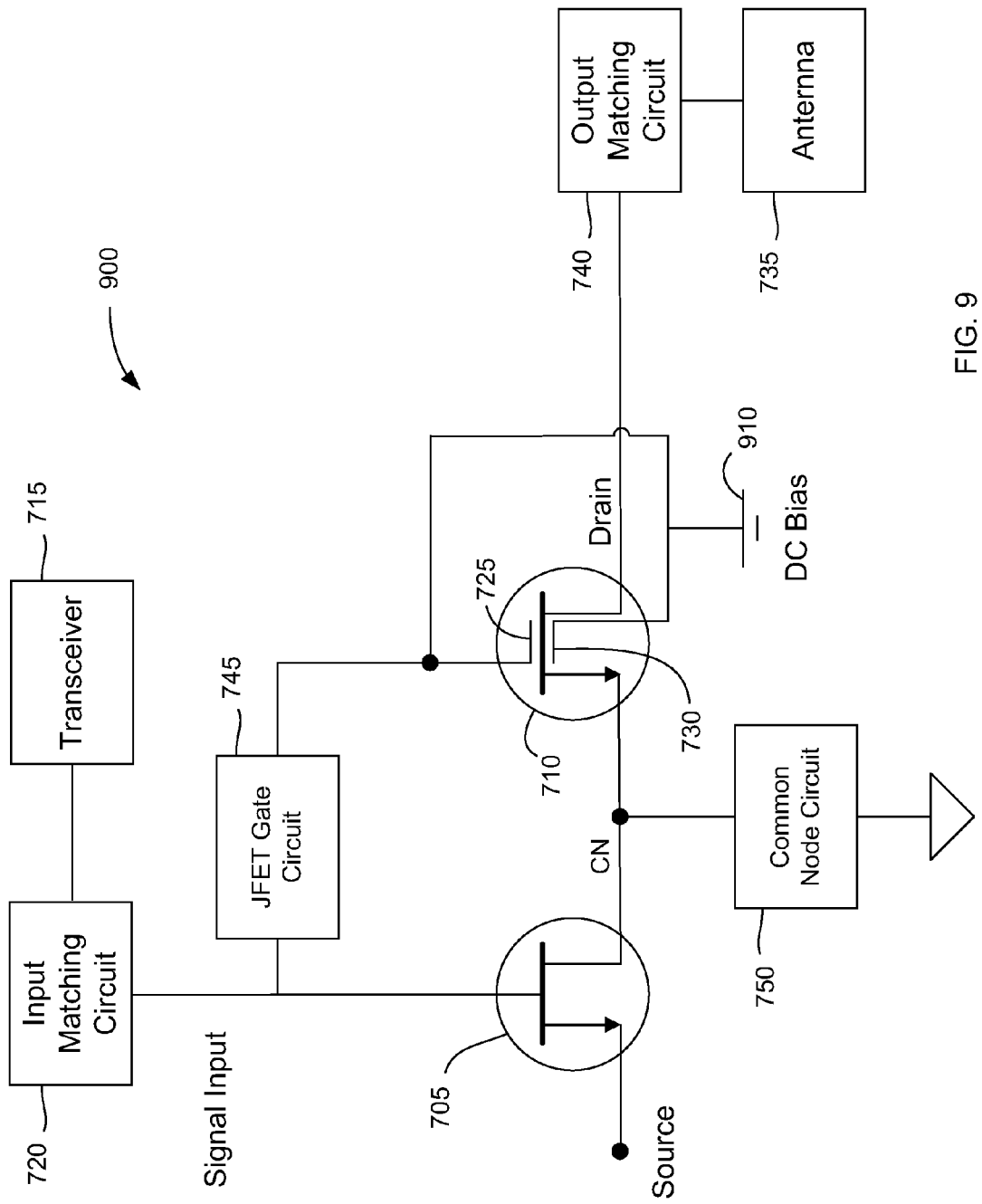
FIGS. 9-15 provide circuit diagrams for several exemplary electronic circuits comprising a MOSFET and a dual-gate JFET, according to various embodiments of the present invention.

FIG. 9 provides a circuit diagram for an exemplary electronic circuit 900 that comprises the electronic circuit 700 and further comprises a DC bias source 910 coupled to the top and bottom gates 725, 730. In operation, a DC bias voltage is added to the input signal to control the top and bottom gates 725, 730. The DC bias voltage can be positive or negative, in various embodiments. A negative gate voltage can be applied on the top and bottom gates 725, 730 to decrease the common node voltage, ensuring in this way that the drain of the MOSFET 805 remains in its reliable zone. On the contrary, a positive voltage can be applied on the top and bottom gates 725, 730 to use the complete excursion of the reliable drain voltage to increase performance. In embodiments such as electronic circuit 900, and in those embodiments described below, the MOS and JFET gate circuit 745 and the common node circuit 750 are both optional.

Figure 10:
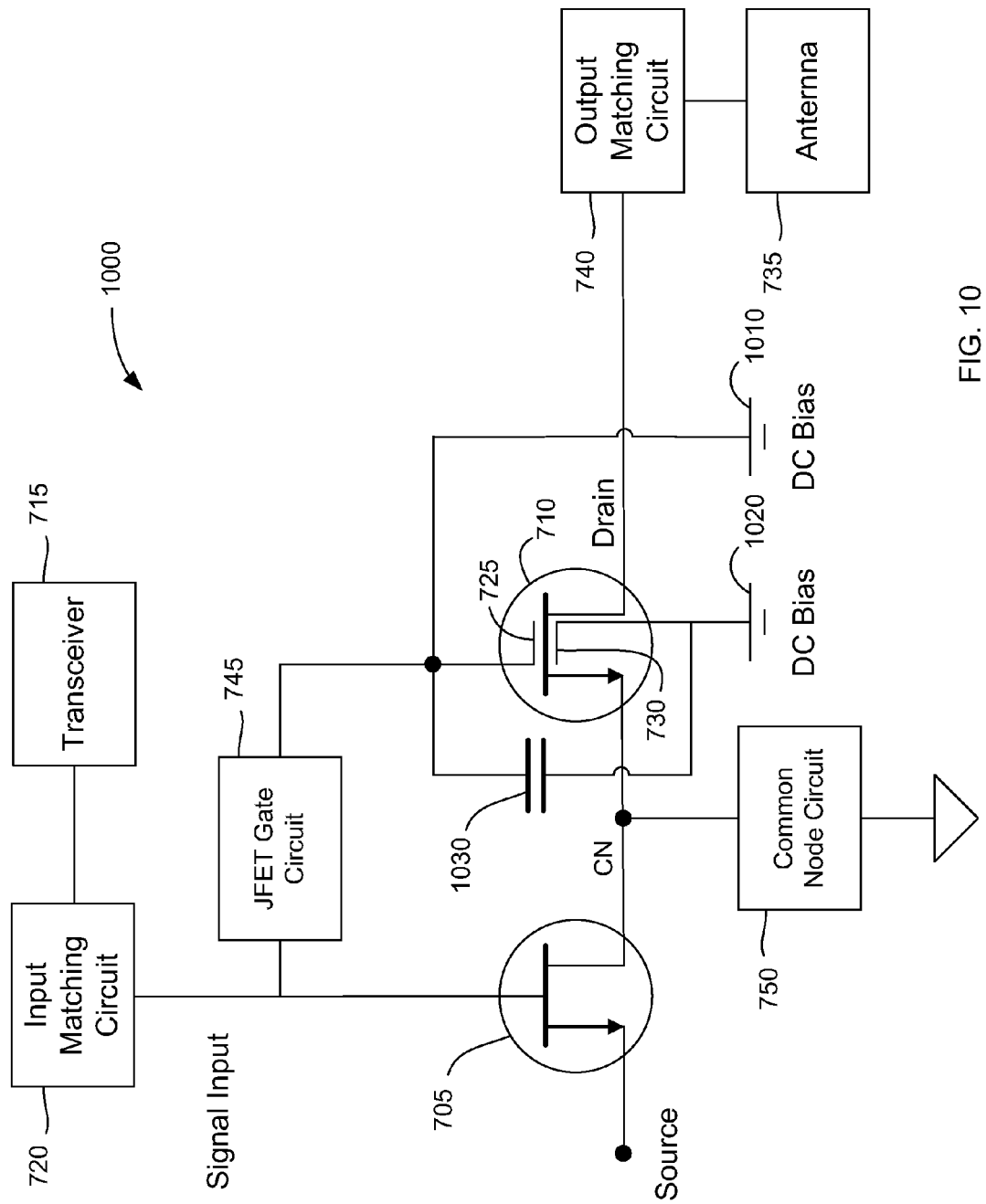

FIG. 10 provides a circuit diagram for an exemplary electronic circuit 1000 that comprises the electronic circuit 700 and further comprises a first DC bias source 1010 coupled to the top gate 725 and a second DC bias source 1020 coupled to the bottom gate 730. In operation, independent DC bias voltages are added to the input signal to independently control each of the top and bottom gates 725, 730. Each DC bias voltage can be positive or negative, in various embodiments. A capacitor 1030 is added between both top and bottom gates 725, 730 to allow a different DC bias to be applied to each, while applying the same RF coupling to each of the top and bottom gates 725, 730 as is applied to the gate of the MOSFET 705.

Figure 11:
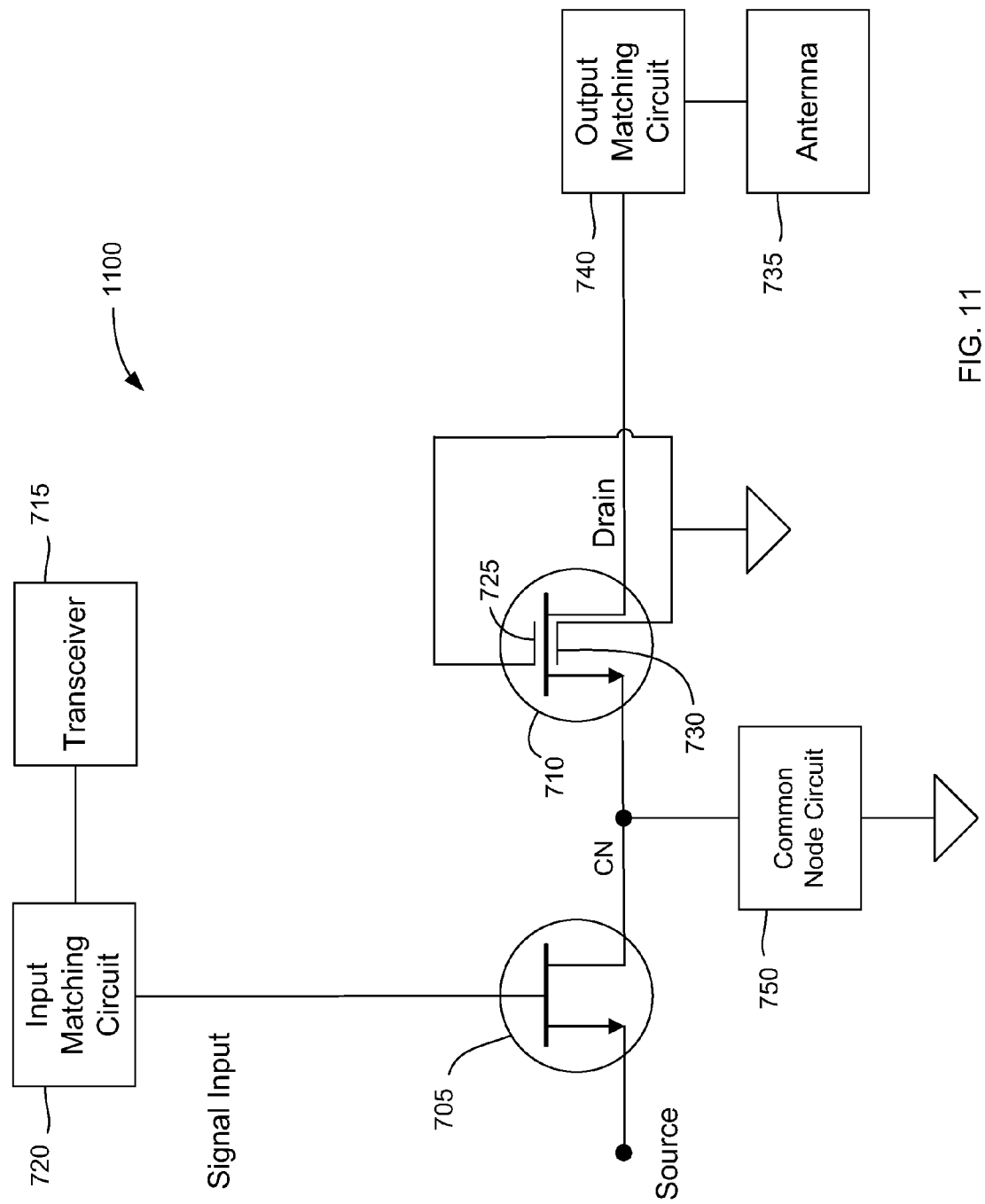

FIG. 11 provides a circuit diagram for an exemplary electronic circuit 1100 that comprises the electronic circuit 700 but without the MOS and JFET gate circuit 745 and wherein the top gate 725 and the bottom gate 730 are both coupled to ground.

Figure 12:
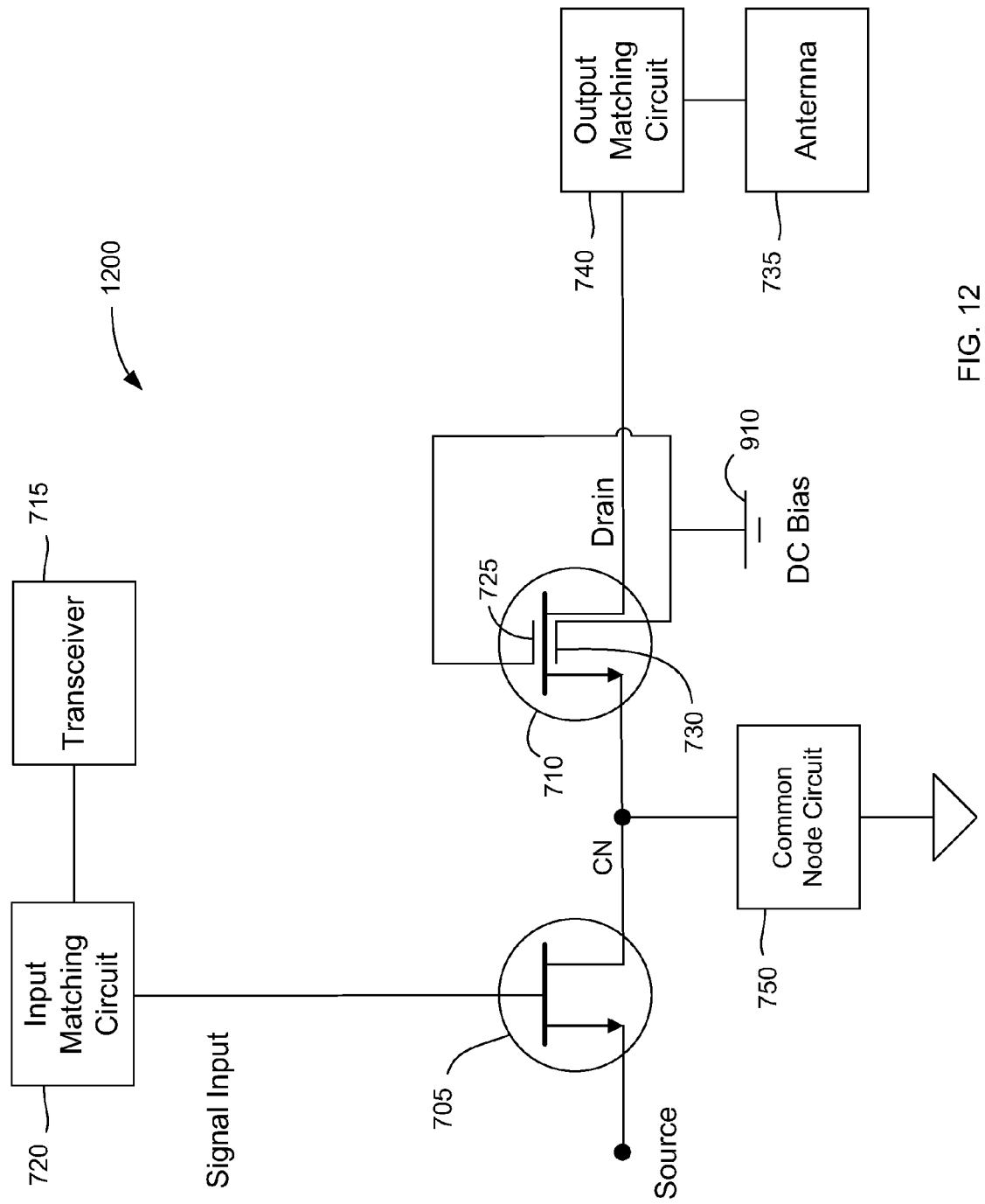

FIG. 12 provides a circuit diagram for an exemplary electronic circuit 1200 that comprises the electronic circuit 700 but without the MOS and JFET gate circuit 745 and wherein the top gate 725 and the bottom gate 730 are both coupled to the DC bias source 910. The DC bias voltage can be positive or negative, in various embodiments.

Figure 13:
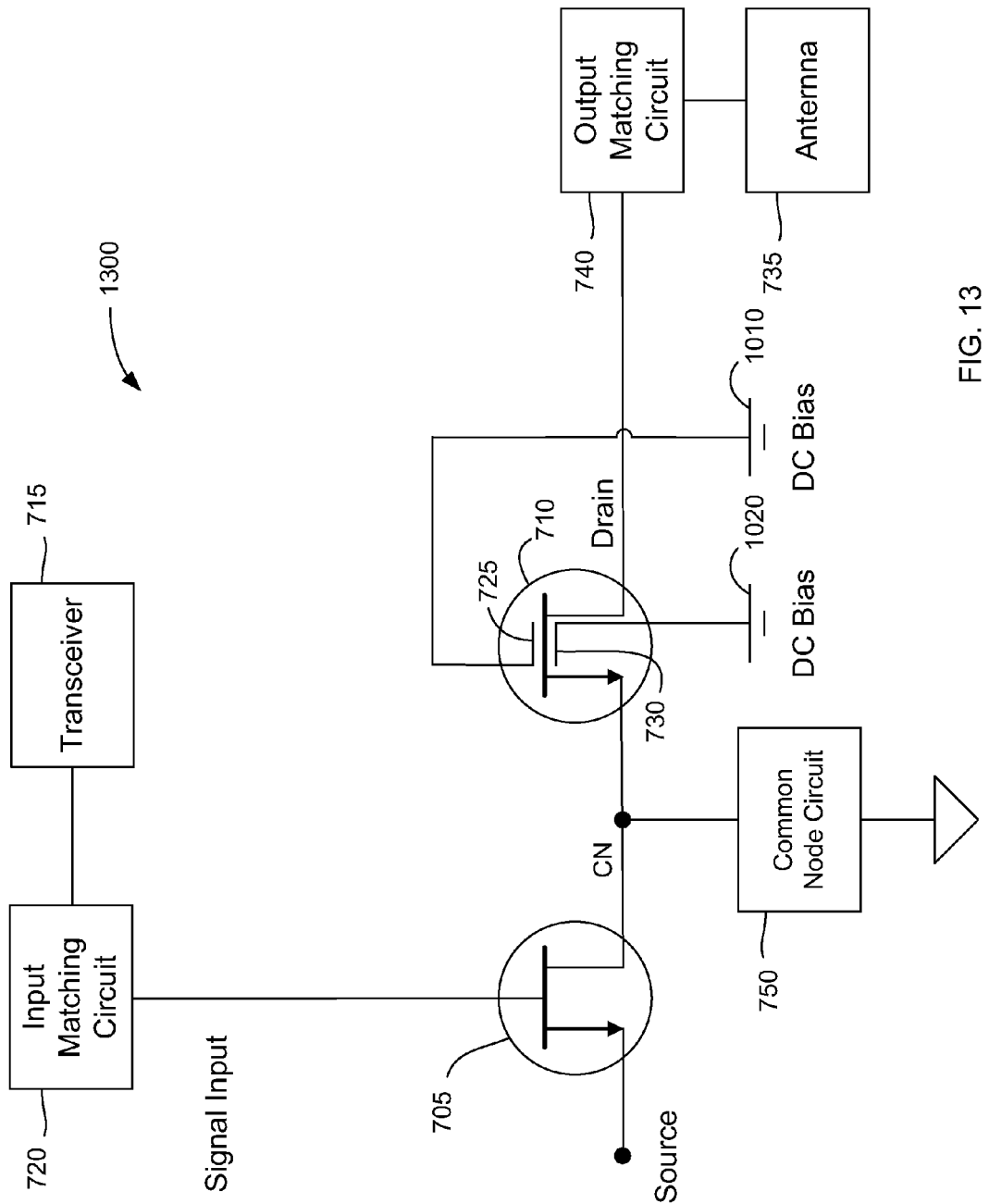

FIG. 13 provides a circuit diagram for an exemplary electronic circuit 1300 that comprises the electronic circuit 700 but without the MOS and JFET gate circuit 745. Additionally, as opposed to FIG. 7, the first DC bias source 1010 is coupled to the top gate 725 and the second DC bias source 1020 is coupled to the bottom gate 730 rather than the top and bottom gates 725, 730 being dependent. Each DC bias voltage can be positive or negative, in various embodiments. In those embodiments illustrated by FIGS. 11-13 control of the top and bottom gates 725, 730 is independent of the input signal.

Figure 14:
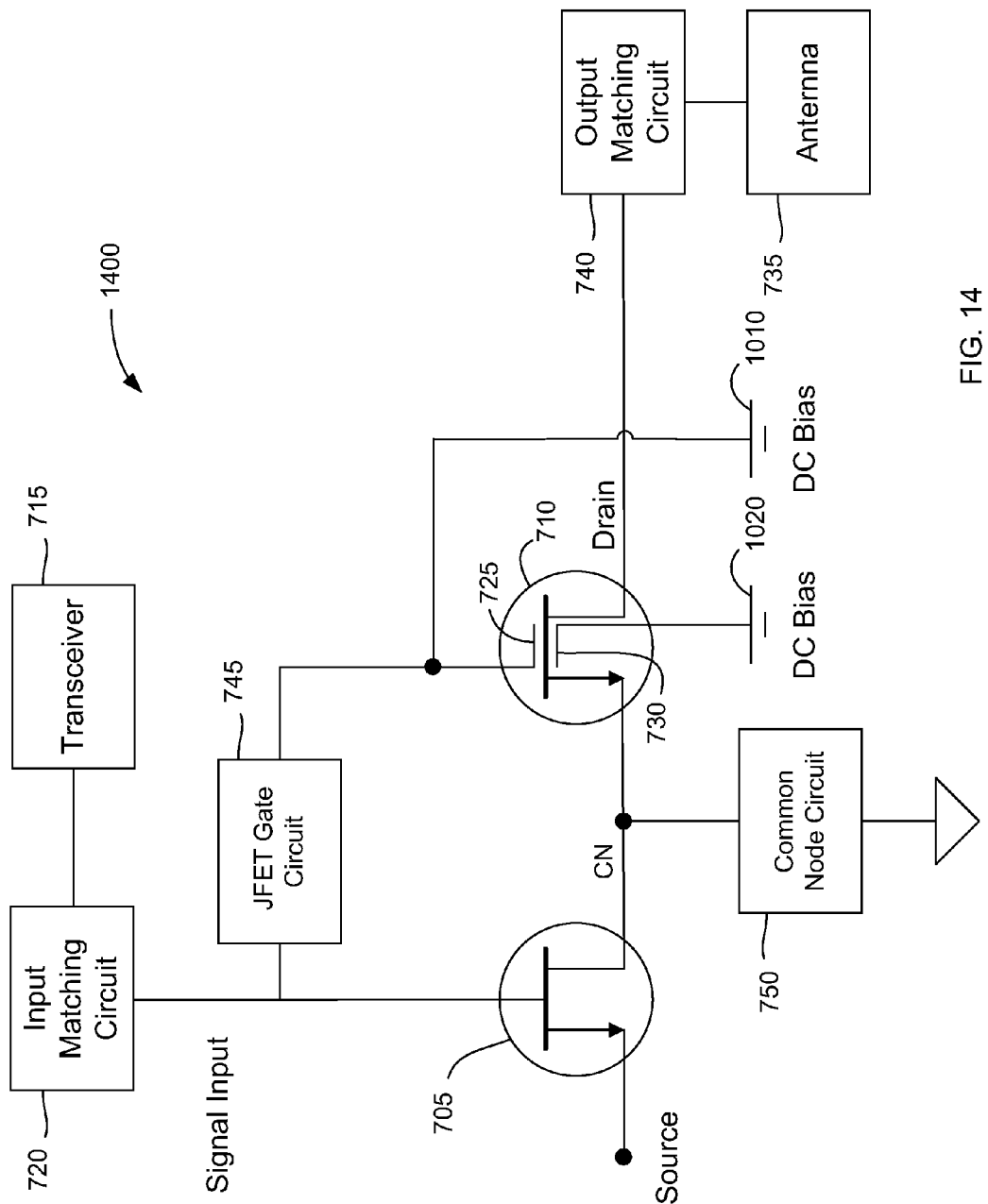
Figure 15:
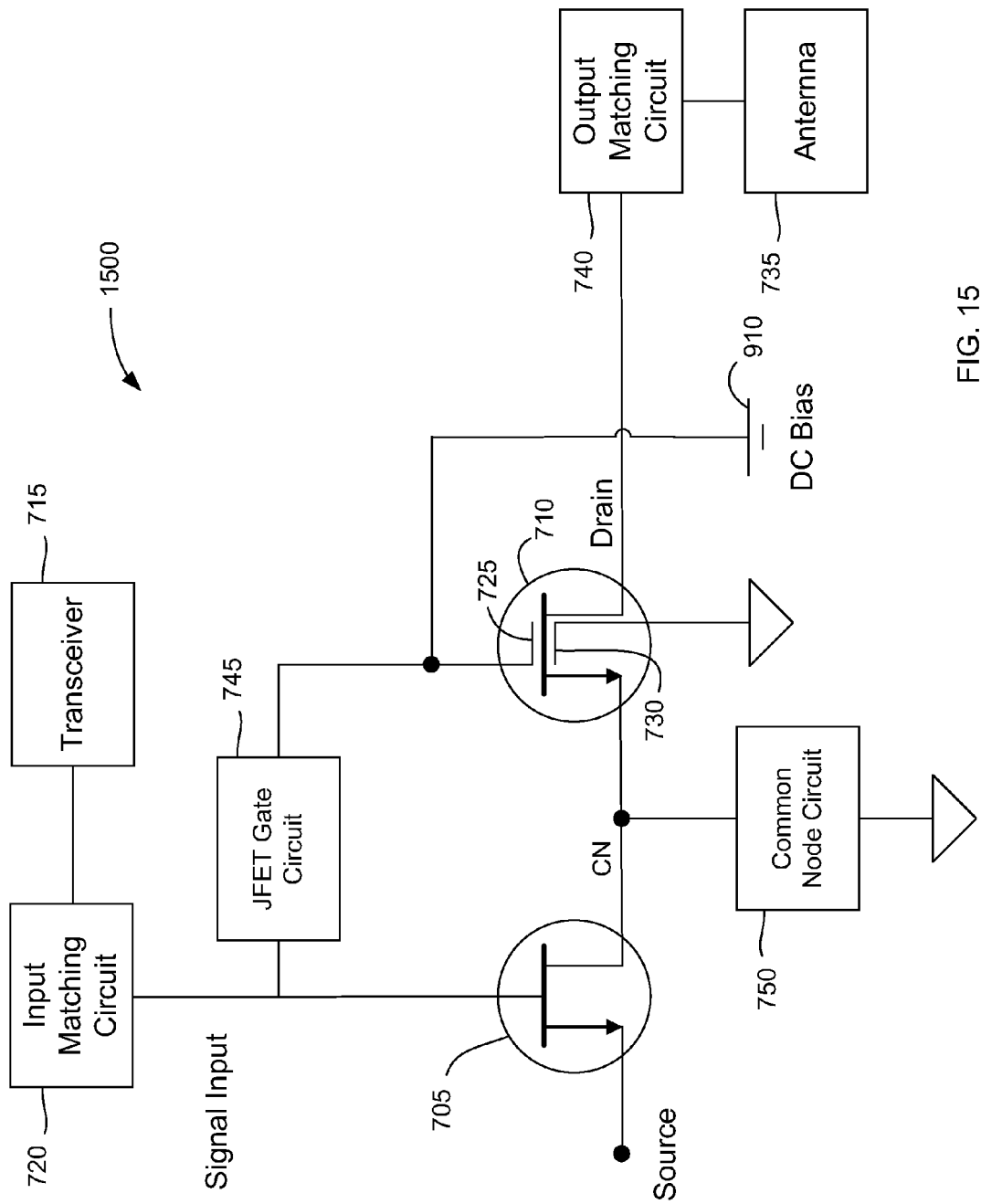

FIG. 14 provides a circuit diagram for an exemplary electronic circuit 1400 that comprises the electronic circuit 1300 and further comprises the MOS and JFET gate circuit 745. FIG. 15 provides a circuit diagram for an exemplary electronic circuit 1500 that comprises the electronic circuit 700, modified such that the bottom gate 730 is independent of the top gate 725, and further comprising the DC bias source 910 coupled to the top gate 725 while the bottom gate 730 is coupled to ground. In those embodiments illustrated by FIGS. 14 and 15 control of the top gate 725 is dependent upon the input signal while control of the bottom gate 730 is independent of the input signal. An advantage to only applying the RF signal to the top gate 725 of the JFET 710 is that the capacitance between top gate 725 and drain or source terminals is smaller than the capacitances between the bottom gate 730 and the source or drain terminals, and that the top gate 725 is more efficient than the bottom gate 730 for controlling the channel current flow.

Figure 16:
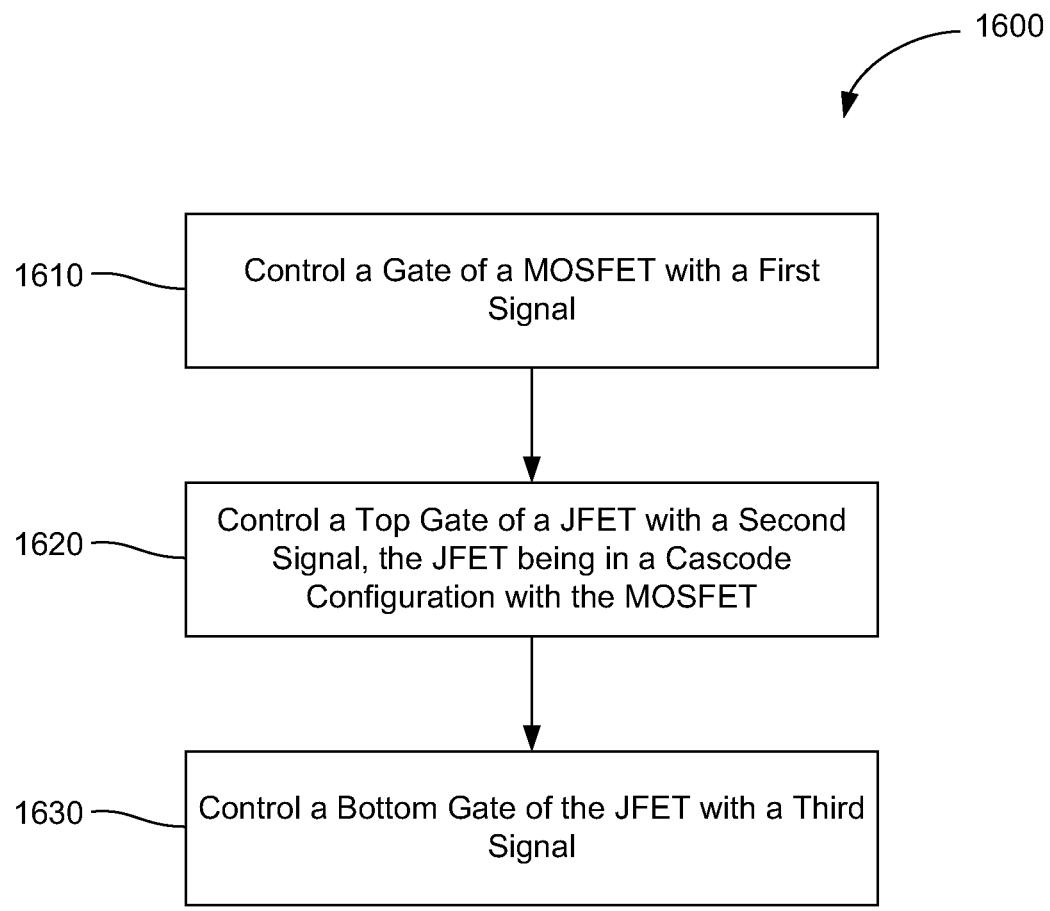
FIG. 16 provides a flowchart representation of an exemplary method for amplifying a signal with a MOSFET and a dual-gate JFET in a cascode configuration.

FIG. 16 provides a flowchart representation of an exemplary method 1600 for amplifying a signal with a MOSFET 705 in a cascode configuration with a dual-gate JFET 710. The method comprises a step 1610 of controlling a gate of a MOSFET with a first signal, namely, the input signal to be amplified, a step 1620 of controlling a top gate of a JFET with a second signal, and a step 1630 of controlling a bottom gate of the JFET with a third signal. It will be appreciated that the steps illustrated by FIG. 16 are intended to be performed concurrently.

In various embodiments, the second signal is dependent upon the first signal and in some of these embodiments the two signals are the same, for example, where the gate of the MOSFET and the top gate of the JFET are capacitively coupled. In some of these embodiments the third signal is also dependent on the first and second signals, such as is illustrated by FIG. 7, while in other embodiments the third signal is independent of the first and second signals, such as in FIGS. 14 and 15.

In various embodiments the second signal is independent of the first signal, such as is illustrated by FIGS. 11-13. In some of these embodiments the third signal is dependent upon the second signal while in other embodiments the third signal is independent of the second signal.

In various embodiments the first signal comprises the sum of the input signal and a DC bias. Also in various embodiments either or both of the second and third signals can be a fixed DC bias, either positive or negative, or ground.

Figure 17:
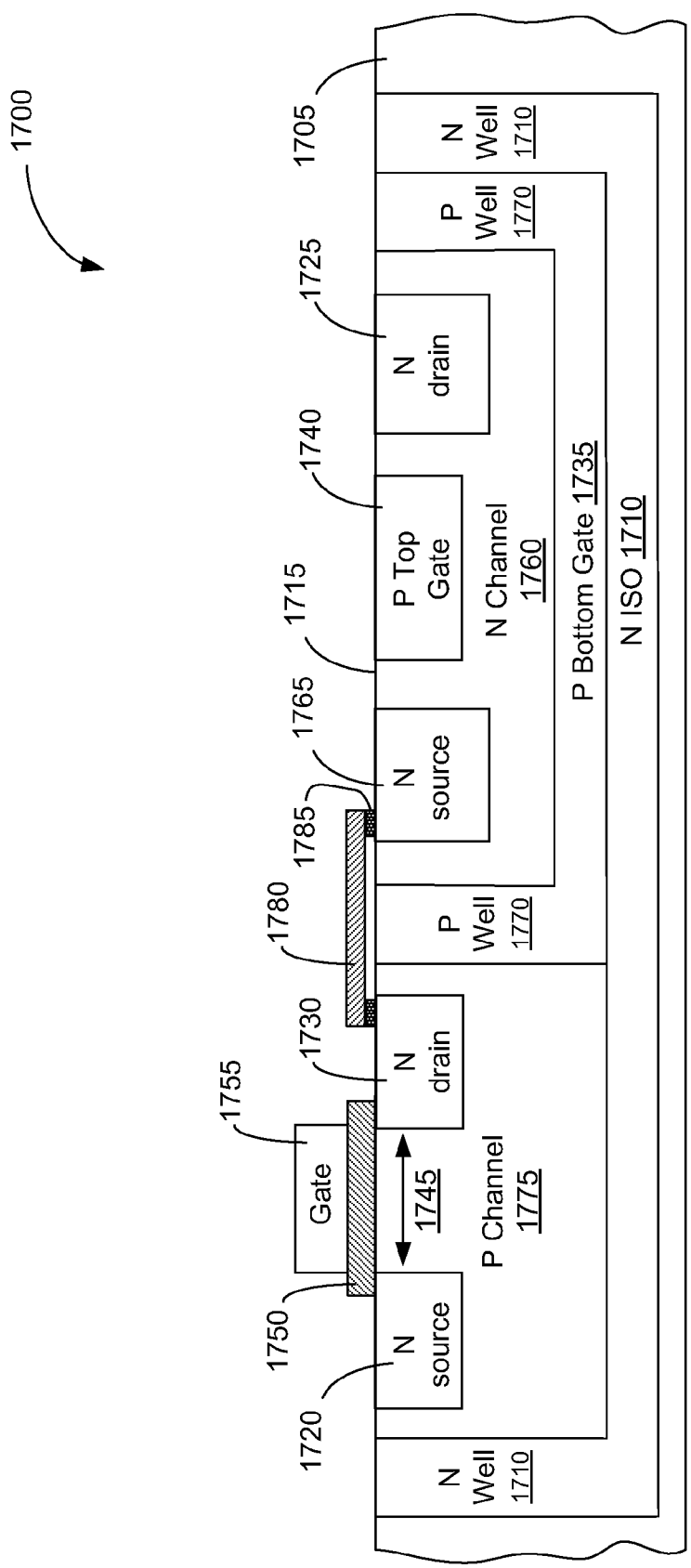
FIG. 17 is a cross sectional view of a MOS device according to an exemplary embodiment of the present invention.

FIG. 17 provides a cross sectional view of still another exemplary MOS device 1700 of the present invention. The MOS device 1700 comprises a substrate 1705 including a first well 1710 defined in the substrate 1705. The first well 1710 is characterized by a top surface 1715 and has, defined therein, a first source 1720, a first drain 1725 and a second drain 1730, a bottom gate 1735, a first top gate 1740. The top surface 1715 is coincident with the top surface of the substrate 1705 and can be formed, for example, by a planarization process. The first well 1710 also includes an isolation structure that isolates the first well 1710 from the remainder of the substrate 1705; the isolation structure comprises an isolation layer disposed parallel to the top surface 1715 and also includes two sidewalls, each joined to an opposing end of the isolation layer, and each extending to the top surface 1715. Depending on context, the term "well" as used herein can refer to either the isolation structure or the entire volume enclosed thereby where the structure and enclosed volume are structurally distinguishable due to different dopings.

The first source 1720 and the second drain 1730 are spaced apart by a gap 1745. The MOS device 1700 also comprises a dielectric layer 1750 disposed above the top surface 1715 of the first well 1710 and aligned with the gap 1745, and also a second top gate 1755 disposed above the dielectric layer 1750 and likewise aligned with the gap 1745. The second top gate 1755 can comprise a conductive material such as polysilicon or a metal, for example. The first well 1710 further includes a first channel 1760 defined between the bottom gate 1735 and the top surface 1715.

In the embodiment of FIG. 17, the bottom gate 1735 is bounded by two sidewalls 1770 each joined to an opposing end of the bottom gate 1735, and at least one sidewall 1770 extending to the top surface 1715. The sidewalls 1770 together with the bottom gate 1735 define a second well disposed within the first well 1710. The first drain 1725, first top gate 1740, first channel 1760, and a second source 1765 are disposed within the second well such that the first top gate 1740 is disposed between the first drain 1725 and the second source 1765. The sidewalls 1770 electrically connect the bottom gate 1735 to the top surface 1715 where at least one electrical contact (not shown) can permit a bias voltage to be applied to the bottom gate 1735. In this embodiment, the first channel 1760 is confined between the sidewalls 1770. The first drain 1725, first top gate 1740, second source 1765, and bottom gate 1735 and first channel 1760 collectively form a JFET in these embodiments.

In various embodiments, the substrate 1705 can be silicon have a first doping, for example, P−, the isolation structure of the first well 1710 can have a second doping, such as N−, the bottom gate 1735 can have a third doping, such as P+, the first source 1720, first drain 1725, second drain 1730, and second source 1765 can have a fourth doping such as N+, and the top gate 1740 can have a fifth doping such as P+ which optionally can be the same doping as the third doping of the bottom gate 1735. The remaining material within the second well, including the first channel 1760, can have a sixth doping, such as N− which optionally can be the same doping as the second doping of the first well 1710. The remaining material within the first well 1710 but outside of the second well includes the first source 1720, the second drain 1730, and the gap 1745. This material, with the exception of the first source 1720 and the second drain 1730, can be viewed as a third well disposed within the first well 1710 and have a seventh doping, for example P−, which optionally can be the same doping as the first doping of the substrate 1705. This material, in and around the gap 1745, constitutes a second channel 1775 having the seventh doping. The first source 1720, second drain 1730, second top gate 1755, and second channel 1775 collectively form a MOSFET. The material within the second and third wells are doped such that when one is doped to be n-type the other is doped to be p-type. The third well, in these embodiments, lacks a defining structure that is analogous to the isolation structure of the first well 1710 and the bottom gate 1735 and sidewalls 1770 of the second well, but can be defined as the portion of the enclosed volume of the first well 1710 that is not within the second well.

In the embodiment of FIG. 17, one sidewall 1770 is disposed between the second drain 1730 and the second source 1765. Material within the second well electrically insulates the second source 1765 from this sidewall 1770, while material within the third well electrically insulates second drain 1730 from this sidewall 1770. Since this sidewall 1770 is insulated from both the second drain 1730 and the second source 1765, electricity cannot flow between them. Rather, the second drain 1730 is directly coupled to the second source 1765 by a metal layer 1780 and vias 1785 to provide an electrical path between them.

Electrical contacts (not shown) disposed on the top surface 1715 provide electrical connections to the gates 1735, 1740, the sources 1720, 1765, the drains 1725, 1730, and optionally the first well 1710. The second gate 1755 is likewise electrically connected by an electrical contact. The gates 1735, 1740, 1755 can be controlled as described in the above embodiments. The first well 1710 optionally can be biased through the electrical contacts.

Figure 18:
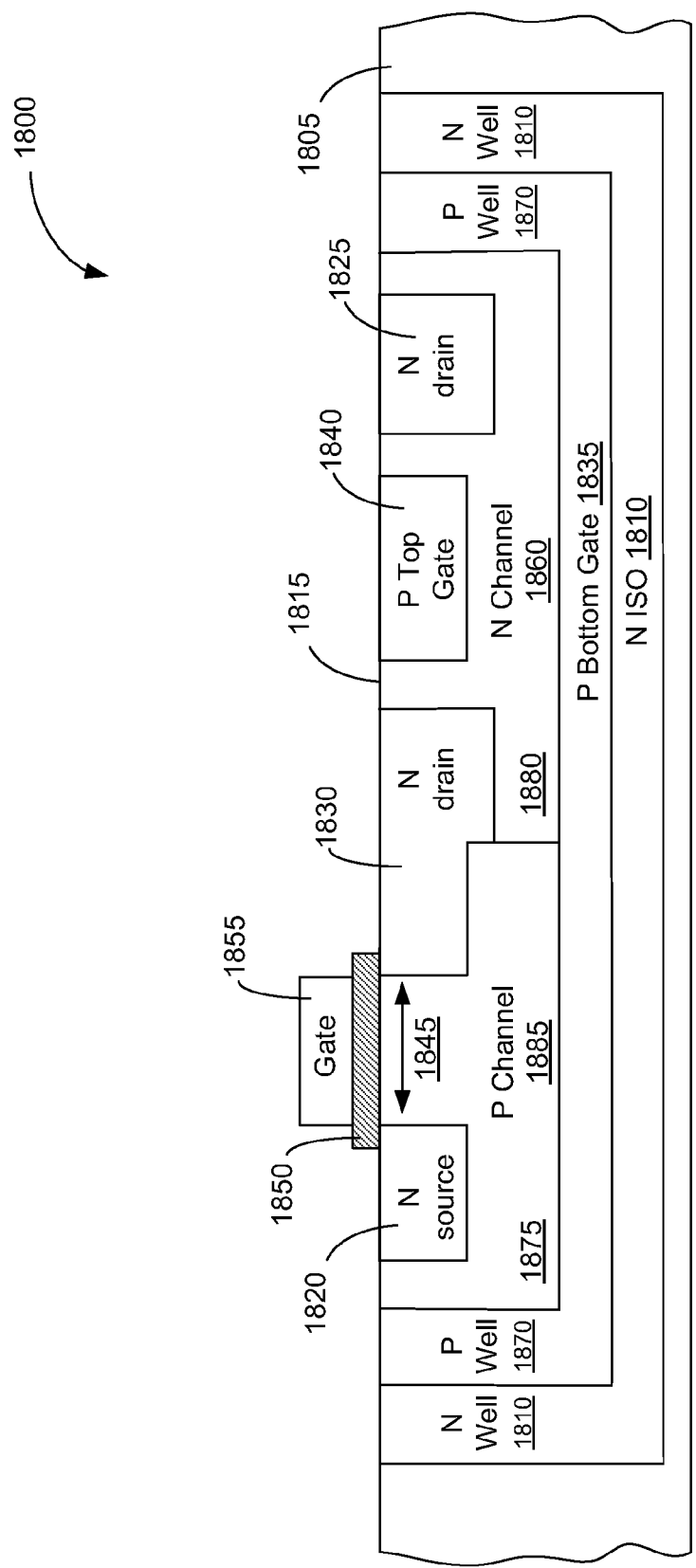
FIG. 18 is a cross sectional view of a MOS device according to another exemplary embodiment of the present invention.

FIG. 18 provides a cross sectional view of yet another exemplary MOS device 1800 of the present invention. The MOS device 1800 comprises a substrate 1805 including a first well 1810 defined in the substrate 1805. The first well 1810 is characterized by a top surface 1815 and has, defined therein, a first source 1820, a first drain 1825 and a second drain 1830, a bottom gate 1835, and a first top gate 1840. The top surface 1815 is coincident with the top surface of the substrate 1805 and can be formed, for example, by a planarization process. The first well 1810 also includes an isolation structure that isolates the first well 1810 from the remainder of the substrate 1805; the isolation structure comprises an isolation layer disposed parallel to the top surface 1715 and also includes two sidewalls, each joined to an opposing end of the isolation layer, and each extending to the top surface 1815.

The first source 1820 and the second drain 1830 are separated by a gap 1845. The MOS device 1800 also comprises a dielectric layer 1850 disposed above the top surface 1815 of the first well 1810 and aligned with the gap 1845, and also a second top gate 1855 disposed above the dielectric layer 1850 and likewise aligned with the gap 1845. The second top gate 1855 can comprise a conductive material such as polysilicon or a metal, for example. The first well 1810 further includes a first channel 1860 defined between the bottom gate 1835 and the top surface 1815.

In the embodiment of FIG. 18, the bottom gate 1835 is bounded by two sidewalls 1870 each joined to an opposing end of the bottom gate 1835, and at least one sidewall 1870 extending to the top surface 1815. The sidewalls 1870 together with the bottom gate 1835 define a second well disposed within the first well 1810. The first source 1820, second drain 1830, first top gate 1840, first drain 1825, and first channel 1860 are all disposed within the second well with the first top gate 1840 and second drain 1830 disposed between the first source 1820 and the first drain 1825 and with the first top gate 1840 being disposed between the first and second drains 1825, 1830. The sidewalls 1870 electrically connect the bottom gate 1835 to the top surface 1815 where electrical contacts (not shown) can permit a bias voltage to be applied to the bottom gate 1835.

In various embodiments, the substrate 1805 can be silicon have a first doping, for example P−, the isolation structure of the first well 1810 can have a second doping, the bottom gate 1835 can have a third doping, such as P+, the first source 1820, first drain 1825, and second drain 1830 can have a fourth doping such as N+, and the top gate 1840 can have a fifth doping such as P+ which optionally can be the same doping as the third doping of the bottom gate 1835.

The remaining material within the second well is divided into two regions, a first region 1875 with a sixth doping and a second region 1880 with a seventh doping where the sixth and seventh dopings are opposite types, meaning that when one doping is an n-type doping the other is p-type. The sixth doping can optionally be the same as the first doping and/or the seventh doping can be the same as the second doping. A boundary between the first region 1875 and the second region 1880 within the second well extends between the bottom gate 1835 and the second drain 1830 such that the second drain 1830 makes contact with both regions 1875, 1880. The first channel 1860 is disposed within second region 1880 and can provide conduction between the two drains 1820, 1830. A second channel 1885 is disposed within first region 1875 and can provide conduction between the first source 1820 and the second drain 1830.

Electrical contacts (not shown) disposed on the top surface 1815 provide electrical connections to the gates 1835, 1840, the source 1820, and the drains 1825, 1830. The second gate 1855 is likewise electrically connected. The gates 1835, 1840, 1855 can be controlled as described in the above embodiments.

The embodiments discussed herein are illustrative of the present invention. As these embodiments are described with reference to illustrations, various modifications or adaptations of the methods or specific elements described may become apparent to those skilled in the art. All such modifications, adaptations, or variations that rely on the teachings of the present invention, and through which these teachings have advanced the art, are considered to be in the spirit and scope of the present invention. Hence, these descriptions and drawings should not be considered in a limiting sense, as it is understood that the present invention is in no way limited to only the embodiments illustrated.

What is claimed is:

1. A MOS device comprising:
   a substrate including a first well defined within the substrate, the well characterized by a top surface and having, defined within the well—
   a bottom gate,
   a first channel defined between the bottom gate and the top surface,
   a first source,
   a first drain,
   a second drain between the first drain and the first source,
   a first gate between the first drain and the second drain, and
   a gap between the first source and the second drain;
   a dielectric layer disposed above the top surface of the first well and aligned with the gap;
   a second gate disposed above the dielectric layer and aligned with the gap; and
   a first sidewall and a second sidewall both defined within the first well and both joined to the bottom gate, the bottom gate and two sidewalls defining a second well within the first well.

2. The MOS device of claim 1 wherein the first source, first and second drains, and first gate are all disposed within the second well.

3. The MOS device of claim 1 further comprising a second channel, both channels disposed within the second well, the first and second channels comprising different dopings.

4. The MOS device of claim 3 wherein the first channel provides electrical conduction between the second drain and the first drain and is controlled by the first gate, and the second channel provides electrical conduction between the first source and the second drain and is controlled by the second gate.

5. The MOS device of claim 1 wherein the second gate comprises polysilicon.

6. The MOS device of claim 1 further comprising a first electrical contact disposed on the top surface in contact with the first sidewall.

* * * * *